US012750966B2

(12) United States Patent
Volckaert

(10) Patent No.: US 12,750,966 B2
(45) Date of Patent: Sep. 29, 2026

(54) MODULAR STACKED CONTROL LOOP APPLICATION SYSTEM, METHOD OF COMPOSING A CONTROL LOOP APPLICATION SYSTEM AND USE OF A COMPOSED CONTROL LOOP APPLICATION SYSTEM

(71) Applicant: SOL.ONE, Brugges (BE)

(72) Inventor: Nico Volckaert, Brugges (BE)

(73) Assignee: SOL.ONE, Brugges (BE)

( * ) Notice: Subject to any disclaimer, the term of this patent is extended or adjusted under 35 U.S.C. 154(b) by 199 days.

(21) Appl. No.: 18/571,697

(22) PCT Filed: May 20, 2022

(86) PCT No.: PCT/EP2022/025237
§ 371 (c)(1),
(2) Date: Dec. 18, 2023

(87) PCT Pub. No.: WO2022/242914
PCT Pub. Date: Nov. 24, 2022

(65) Prior Publication Data
US 2024/0215175 A1 Jun. 27, 2024

(30) Foreign Application Priority Data
May 21, 2021 (BE) .................................. 2021/5416

(51) Int. Cl.
*H05K 5/30* (2025.01)
*G06F 1/18* (2026.01)
(Continued)

(52) U.S. Cl.
CPC ............... *H05K 5/30* (2025.01); *G06F 1/181* (2013.01); *G06F 1/185* (2013.01); *G06F 1/188* (2013.01); *H05K 7/1427* (2013.01)

(58) Field of Classification Search
CPC ..... B64U 2201/20; G06F 1/266; G06F 1/181; G06F 1/185; G06F 1/188;
(Continued)

(56) References Cited

U.S. PATENT DOCUMENTS 8,786,133 B2 * 7/2014 Cheng ........................ H02J 3/46 307/82
2013/0293013 A1 * 11/2013 Templeton .............. G06F 1/266 307/64
(Continued)

FOREIGN PATENT DOCUMENTS

EP 3515161 A1 * 7/2019 ............. H05K 7/205

OTHER PUBLICATIONS

International Search Report for PCT/EP2022/025237, mailed Sep. 21, 2022, 4 pages.
(Continued)

*Primary Examiner* — Eric Blount
(74) *Attorney, Agent, or Firm* — Nixon & Vanderhye, P.C.

(57) ABSTRACT

The invention relates to a control loop application system, the system comprises a number of units of electronic circuit boards arranged in a stacked configuration. The system further comprises a top-level unit (520, 620) and at least one additional unit (521-524), the top-level unit (520) having components such that the top-level unit is able to perform as a standalone unit and the at least one additional unit (521-524) having components needed to perform at least one specific function for which the at least one additional unit (521-524) is designed. The invention further relates to a method to determine the number of additional units (521-524) in the control loop application system, the position of the additional units (521-524) in the control loop application system. The invention also relates to a method to compile the
(Continued)

control loop application system and to use pre-certified units in the control loop application system.

23 Claims, 13 Drawing Sheets

(51) Int. Cl.
*G06F 1/185* (2026.01)
*G06F 1/188* (2026.01)
*H05K 7/14* (2006.01)

(58) Field of Classification Search
CPC .. G06F 2200/1635; G06F 1/183; G06F 1/184; H02J 1/10; H02M 1/008; H02M 3/156; H05K 1/115; H05K 5/0082; H05K 5/0247; H05K 7/1422; H05K 7/2039; H05K 7/20418; H05K 7/20845; H05K 7/20854; H05K 5/30; H05K 7/1427
USPC ...................................... 307/43, 64; 340/945
See application file for complete search history.

(56) References Cited

U.S. PATENT DOCUMENTS

| | | | | |
|---|---|---|---|---|
| 2016/0036222 | A1* | 2/2016 | Templeton | H02J 1/10<br>307/24 |
| 2019/0230801 | A1* | 7/2019 | Neuman | H05K 1/115 |

OTHER PUBLICATIONS

Written Opinion of the ISA for PCT/EP2022/025237, mailed Sep. 21, 2022, 7 pages.
Anonymous: “Addressing—PCI device address actually means slot address? And when does PCIe slot get its’ address?—Electrical Engineering Stack Exchange”, Oct. 28, 2019, XP055885731, Retrieved from the internet: URL:https///electronics. Stackexchange.com/questions/299183/pci-device-address-actually-means-slot-address-and-when-does-pcie-slot-get-its [retrieved on Jan. 31, 2022].

* cited by examiner

MODULAR STACKED CONTROL LOOP APPLICATION SYSTEM, METHOD OF COMPOSING A CONTROL LOOP APPLICATION SYSTEM AND USE OF A COMPOSED CONTROL LOOP APPLICATION SYSTEM

This application is the U.S. national phase of International Application No. PCT/EP2022/025237 filed May 20, 2022 which designated the U.S. and claims priority to BE Patent Application No. BE2021/5416 filed May 21, 2021, the entire contents of each of which are hereby incorporated by reference.

FIELD OF THE INVENTION

The present invention relates to the ability to build in and/or use previously certified circuit board assemblies in electronic hardware for a modular control loop application system, more particularly for safety-critical systems, without the need to re-certify the new configuration or layout of the entire setup of circuit board assemblies in a specific electronic hardware configuration. More particular, the invention relates to the assembly of previously certified circuit boards in electronic hardware for avionic purposes without having the need to pre-program and certify the particular assembly as a hole.

BACKGROUND OF THE INVENTION

For aviation systems, the safety and reliability measures taken to ensure that systems do not fail are extremely high. Therefore, systems specifically designed for aviation are considered the safest and mostly tested systems developed. To ensure that these standards are reached by everyone developing for aviation application, regulatory bodies require that any aviation system that may be included in an aircraft meet specific certification requirements. Generally, such certification standards are concerned with the approval of software and airborne electronic hardware for airborne systems (e.g., autopilots, flight controls, engine controls). This includes systems that may be used to test or make aviation systems, e.g., hardware or software to be installed on an aircraft. In the United States, for example, the FAA Aircraft Certification Service develops the policy, guidance and training for software and airborne electronic hardware that has an effect on an aircraft. Of particular relevance are the guidance documents DO-178C or ED-12C for software and DO-254 or ED-80 for hardware, that airborne systems must comply to.

The development and certification of software-intensive systems for aviation is extremely labor intensive. Steps include building planning documents that explain in detail how the applicant will comply with guidelines on development, verification, configuration management and quality assurance, and which standards the applicant will use for requirement writing, modelling, design, and coding. The system requirements are refined into a set of high-level requirements for the software and for the hardware. For software, these are further refined into an architectural design that can achieve the high-level requirements. Next, low-level requirement are developed that specify how to implement the high-level requirements within the context of the architectural design. These low-level requirements should be detailed enough such that testing these requirements will cover all aspects of the code. The source code is developed to comply with the low-level requirements.

Source code and design are reviewed, requirements are tested until all decision points are covered, or even every condition inside each decision point is tested. The amount of work before coding starts is significantly larger than the coding itself, but the verification dwarfs all of the development work.

For hardware, the focus is more on the design but especially when using programmable logic the amount of work is similar.

These standards are in place to maximize the probability of error-free code, and indeed software developed this way has been working safely for decades. For safety reasons, it is a good idea to keep the process at least as rigorous as it currently is.

However, from a practical point of view, the increase of avionics in an aircraft is on an exponential scale. Almost all aircrafts are delayed to market, or have very long market lead times, due to the enormous, and rapidly rising, amount of work it takes to prove the correctness of an aircraft.

Tools and methods have been developed to reduce the work. Authorities have provided guidelines on how to correctly automate some of the development and verification objectives. Tool vendors have created tools, such as automatic code generators. When qualified, the generated code does not need to be reviewed. However, coding is only a smaller part of the overall project. These tools have an important but overall minor effect on the time to market of new aircraft.

Likewise, reusing of circuit board assemblies (CBA's) which have gone through the entire certification process, is a preferred way of reducing the overall time to develop and allows for a cost reduction since the CBA's can be designed so that they are usable for more than one particular setup or use, compared to custom tailed CBA's, which then individually need to go through the certification process one by one. Examples of CBA's which are good candidates for reuse are processor boards, interface cards, power supplies, etc. Re-usable CBA's will have to be designed according to a specific standard in terms of size and Input/Output (I/O) to allow reuse. An ANSI standard which is widely used in integrated modular avionics (IMA) is the VITA 46 or VPX standard. This standard defines the dimensions of the cards. Common boards are 3 U boards which have a dimension of 160 mm×100 mm or 6 U boards with dimensions of 160 mm×233 mm.

Not only the size of the boards is standardized, also the type of connectors and interfaces are standardized to allow the exchangeability of the boards in other applications. Compliant the VITA 46 standard, a common backplane or motherboard is used to allow the different CBA's to be plugged into.

FIG. 1 shows a schematic layout of a VITA 46 compliant 3 U system 10 currently used in e.g. avionic appliances. Slots 80 are foreseen in a backplane 20, in which the different CBA's 30, 40, 50 and 60 can be plugged in. A general VITA 46 compliant interconnection board 70 is also installed on the backplane 20. Such a 3 U system 10 is considered to be a modular system since it allows for previously developed and certified CBA's to be integrated into a new setup. Also, an existing system can be altered in functionality by adding additional CBA's or even CBA's can be removed when not needed in a particular solution so as to reduce cost in no longer having components in the system which are not needed, less weight on board of an avionic device and/or power consumption during use. Also, such a 3 U system 10 allows a straightforward manner to change the interconnection board 70 to accommodate for the costumers requirements without impact on the overall system.

Some CBA's 30, 40 and 50 are always present in a typical 3 U system 10. These are the Processor card 30, the General Interfaces card 40 and the Power supply 50. The additional interfaces 60 are optional and are only added when required for the solution for which the system 10 is compiled. The total configuration of the system 10 being the backplane 20, CBA's 30, 40, 50, 60 and interconnection board 70 together will form the computer which is then to be installed on board of e.g. the airplane. It is clear from FIG. 1 that removing these additional interfaces 60 will have an impact on the total weight and power consumption of the entire system 10, however, the size of the system 10 will remain the same with or without these additional interfaces 60 installed.

Although there are a lot of benefits when using such a 3 U system 10, one significant problem which such a system is that it is an expensive solution in terms of size and weight. The mechanical dimensions do not grow with the required interfaces, but the system 10 needs to be designed to accommodate for the worst case scenario. Also, the interconnection board 70 needs to be able to hold interfaces for all possible signals and will therefore always be over-dimensioned. This will have an impact on the minimum height and width of the unit, since all possible interfaces will need to find a space on this interconnection board 70. Also, the backplane 20 needs to provide for sufficient slots 80 to hold all possible interface cards, which will thus determine and in most cases over-dimension the total depth of the system 10. Although the size and weight of these 3 U based systems might still be acceptable in traditional avionics, they cannot be considered as low SWaP (Size, Weight and Power) solutions as requested in Urban Air Mobility (UAM) and/or Unmanned Arial Vehicle (UAV) projects.

To overcome the need to over dimension and prepare a system for the worst case scenario, an alternative design to the backplane layout of FIG. 1, was developed. Instead of using a backplane as represented in FIG. 1, the different CBA's are now placed in a stacked configuration to create a stackable system 100 as is represented in FIG. 2. In such a stackable system it is already known to stack standardized boards on top of each other like building blocks. Similar to the VITA 46 standard, the PC/104 standard defines four mounting holes at the corners of each module or CBA, which allow the boards to be fastened to each other using standoffs 190. The use of stackable CBA's and standoffs provide for a more robust mounting than slot boards found in the backplane layout of FIG. 1, because the compact board size contributes to the robustness by reducing the possibility of the CBA's flexing under shock and vibration.

In the system of FIG. 2, all necessary CBA's or boards 130, 140, 150, 160 are placed one on top of the other, with spacers or standoffs 190 between the different boards installed on the mounting holes at the corners of each board. From a cost saving point of view, and also in view of certification of the system, the interconnection board again will hold all possible I/O connectors which are typically needed in avionic appliances. The system is then mounted inside a housing 105 which can then be build inside e.g. a cockpit environment of an aircraft. Data transfer between the different boards is accomplished by the installation of connectors 180 such us a PCI-express connector. The connectors 180 can function as an interface between a device (e.g. a PCIe device) on the top level unit and a similar device on each additional unit. These connectors may be able to pass signals from one board to the other board. Such connectors and devices are very complex and thus expensive, but absolutely necessary to provide for the communication between the different boards. Such a stacked system is disclosed in EP 3 515 161, where a number of CBA's are stacked on top of each other, and the components needed for the total function of the system are divided over the different CBA's. Synergy is needed between the different CBA's, since some components are located on a different CBA.

As is the same with the system of FIG. 1, the stacked configuration system of FIG. 2 as a total will form the computer which can be built into the airplane. Once completed, the computer is unchangeable due to the existence of synergies between the different units installed in the computer and for each application or new system, a new certification process is needed during which it is proved that the computer is safe and performing under all possible conditions which can occur on board of an airplane. This is necessary in both examples of FIG. 1 and FIG. 2, because specific components are located on specific boards alone, which are also needed by the other boards to function and only when all boards are placed together a functional computer is achieved. These properties are highly inefficient, and undesirable. As explained above, such a certification process is extremely time consuming and expensive and is considered as the biggest reason for the slow development of faster and better on-board computers and the reason why aircraft manufacturers often are forced to return to older types of on-board computers.

The object of the invention is therefore to allow a high degree of freedom to build together a new assembly without the need to go through a lengthy and costly re-certification and testing protocol and thus to overcome the need to re-certify a new combination of CBA's when stacked together to form a new computer designed for safety critical solutions and more particular to computers in avionic solutions, or if a change in configuration is done by adding, replacing or removing a specific CBA, and by doing so being able to create a computer with the lowest possible SWaP in a short development period. Additionally, it is the object of the present invention to provide for a modular stacked control application system or computer which, is able to identify its function, position and if a defect is occurring on a component or connection of one of the units, without the need to identify and pre-program the location and function of each unit in the stack when assembling the system or computer.

SUMMARY OF THE INVENTION

This object is achieved by the subject matter of independent claim 1 of the present invention. Advantageous embodiments and aspects are described in the dependent claims.

The present approach provides efficient and effective solutions for adapting previously certified circuit board assemblies in electronic hardware for control loop systems, and particularly for safety-critical systems. Advantageously, the present approach avoids the need to re-certify the new configuration or layout of the entire setup of circuit board assemblies in a specific electronic hardware configuration. As a result, embodiments of the present approach are significantly more efficient and effective for new control loop systems, and avoid both the need to complete expensive and lengthy certification processes and the contemporary option of using older, less efficient control loop systems. Additionally, because of the exchangeability of the units in the control system, it is possible to only stock a limited number of units, rather than an entire control system of computer, and thus have a more cost efficient stock system in place.

According to an embodiment of the invention, a control loop application system comprises a number of units of electronic circuit boards that may be arranged in a stack. The number of units of electronic circuit boards may vary depending on the embodiment, but generally comprises of a top-level unit and at least one additional unit. The top-level unit having components such that the top-level unit is able to perform as a standalone unit, that is without requiring an additional unit to be a working and functional unit, and the at least one additional unit having components needed to perform at least one specific function for which the at least one additional unit is designed, such as specific I/O interface(s) and software. The top-level unit may function on a standalone basis, and may also operate with one or more additional units depending on the embodiment. Having a top-level unit which is able to function as a standalone unit, will allow for the addition of at least one unit with a specific function to this standalone unit. By doing so, the additional unit or units together with this top-level unit will be able to function as a system for which a pre-certification process can be completed. Once this pre-certification process is completed for all types of combinations of additional units with the standalone top-level unit, the various units can be combined in a single system, without the need to re-certify the new combination. This approach effectively eliminates the individual certification process of each new combination of stacked CBA's and will drastically lower the development period for a new combination of CBA's in a stacked configuration of the present invention.

According to a preferred embodiment, each additional unit will have at least one I/O interface directly installed on the specific additional unit to accommodate for the at least one specific function of the additional unit. This has the advantage that each additional unit will carry only the I/O interfaces required to perform the task for which the additional unit was designed, and no additional interfaces will need to be foreseen as was the case in the prior art stacked configuration. Additionally, if an I/O interface of a specific additional unit is malfunctioning when build into a specific stack configuration, the malfunctioning of the system will be limited only to this particular I/O interface of this additional unit. According to a further preferred embodiment, the I/O interfaces are directed to the same side in the stack. That way, easy access to the I/O interfaces is still maintained although they are located on different additional units in the stack.

According to another embodiment of the present invention, the power supply for the entire system is located on the top-level unit. Providing the power supply on the top-level unit, will allow for the re-use of the top-level unit with the other additional units to complete the pre-certification process. Additionally, since the power needed by the additional units can be taken from the top-level unit, each additional unit can be built with the components specifically needed for the function of this additional unit which will result in a more simplified unit with a limited number of components. Less components required for each individual additional unit will result in a less complex pre-certification process, which again will reduce the complexity and time required to perform the pre-certification process. Also, less components will result in less weight for the entire system once completed, which is an important factor in e.g. avionic applications.

According to a further embodiment of the present invention, each additional unit will operate independently from another additional unit in the stack. This is possible because each additional unit will be equipped with specific components needed only for this additional unit, and will not need to use components on other additional units. Hence, no synergy is needed between the different additional units when they are combined in a stacked configuration to form a new control loop application system. The advantage of such independently operating additional units is that when combined in a new system, no re-certification is needed for this new system due to the lack of synergies between the different additional units. The pre-certification of each individual additional unit, or a combination of additional units, can thus be re-used reducing the development time drastically. Another advantage of having independently operating additional units is that, when one additional unit is malfunctioning, it will have no impact on the other additional units. If an additional unit is malfunctioning, this additional unit can then be replaced by an identical additional unit, without having an impact on the other additional units or to the certification process of the system.

According to yet another embodiment of the present invention, at least one stack connector having a main interface is placed in between the top-level unit and the additional unit located below the top level unit in the stack. This stack connector will allow the top-level unit to communicate with the below placed at least one additional unit in the stack.

Further, at least one additional stack connector having a main interface is placed in between two adjacent additional units in the stack. This additional stack connector will allow the transfer of the signals received from the above unit, regardless of it being the top-level unit or another additional unit, to the below placed additional unit in the stack.

The stack connectors can further comprise at least one additional interface to allow communication between the top-level unit and the at least one additional unit. The main interface of the stack connectors is an I2C slave interface and the at least one additional interface is a serial peripheral interface, a Quad Serial peripheral interface and/or a Peripheral Component Interconnect Express interface. Having additional interfaces in the stack connectors allows the additional units to use the best interface for the particular function of this additional unit. Preferably, the stack connectors may be equipped with all the available interfaces, such that it is able to support all signals which potentially need to be send from one unit to another.

Embodiments of the present invention may also take the form of a method to determine the number of additional units in a stacked control loop application system. The method comprises the steps of sending out a position signal on a first channel of a stack connector by each additional unit in the stack to the unit placed above the each additional unit in the stack, shifting the received position signal from the below unit to the next available channel, repeating the sending out of the position signals and the shifting of the received position signals until all position signals have reached the top-level unit, scanning by the top-level unit of the channels of the stack connector connecting the top-level unit with the additional unit below the top-level unit to determine which channels are sending out a position signal, and determining the number of channels used and correlating this number to the number of additional units. This determination of the number of additional units in the stack will allow the top-level unit to determine how many channels the top-level unit will need to monitor when the system is up and running. Alternatively, the top-level board may be configured to send out a detection signal on all available channels in the stack connector and will need to wait for a reply signal from each additional unit in the stack. Although this is a functional working way of detecting the number of additional units, it has the downside that it requires more time for the detection because all channels have to be scanned and if only a limited number of additional units are used, the top-level unit will have to wait for a period of time to make sure that the channel is not replying on the detection signal before concluding on the number of additional units in the stack. This time-out protocol can be avoided when using the preferred method to determine the number of additional units in the stack and will result in a faster start-up of the system.

According to a further embodiment of the present invention, a method to determine the position of the additional units in a control loop application system by each additional unit is provided. The method comprises the steps of detecting a grounding signal by the top-level unit on a first channel of a stack connector to the below additional unit, shifting the grounding signal from the first channel to the next available channel in the stack connector placed between additional units, determining the position of the additional unit in the stack by the additional unit by determining the channel on which the grounding signal was received by the additional unit and transferring the grounding signal to the next additional unit, repeating the sending out of the grounding signal, the shifting of the received grounding signal, and the determining of the position by the additional unit, until all other additional units have determined their position in the stack. The advantage of determining by each additional unit its position in the stack is that a unique address can now be used by this individual additional unit. Each unit, being the top-level unit or the additional units will have the same protocol embedded in the CBA. This protocol will allow to determine which address will be used depending on the position in the stack. Additionally in a preferred embodiment of the method, once a specific additional unit determines its position in the stack, it will provide this address related information, possibly supplemented with information regarding the function or functions of this additional unit, to the top-level unit. This has the advantage that the top-level unit will know which specific address to use to send specific information to the additional unit.
Alternatively, the step of shifting the grounding signal from the first channel to the next available channel in the stack connector placed between additional units, determining the position of the additional unit in the stack by the additional unit by determining the channel on which the grounding signal was received by the additional unit and transferring the grounding signal to the next additional unit may be replaced by the step of, determining the position of the additional unit in the stack by the additional unit by determining the channel on which the grounding signal was received by the additional unit, shifting the grounding signal from the first channel to the next available channel in the stack connector placed between additional units and transferring the grounding signal to the next additional unit in the method to determine the position of the additional units in a control loop application system by each additional unit.

It is an additional advantage of the system and methods of the present invention that it is not necessary for the top-level unit and additional units to have and know a specific and predefined position in the stack. Each additional unit will be able to work independently from the other additional units in the stack and will only need to know its own position in the stack and needs to understand how to communicate with the top-level unit and be able to receive power from this top-level unit. The individual additional units will not need to be aware of the function of the other additional units which may be present in the stack, because there is no synergy between the other additional units and no communication needs to be possible between the additional units itself. Also, for the top-level unit it is only important to know the function of each additional unit and which protocol it needs to use to send out the information to the particular additional unit and which type of interface it needs to use to send the information. Additionally, receiving by the top-level unit information about the function of each additional unit, additionally allows the top-level unit to perform checks during any time when the control system is active to detect any malfunctioning of a part or the complete control system. In addition to the information sharing about the function of each unit, it may be advantageous if the top-level unit receives from each additional unit in the stack the location of this additional unit in the stack. In case a duplication of a unit in the stack is necessary, the top-level unit will be able to determine how to address a particular additional unit, even if this unit is an exact copy of another additional unit in the stack which would use the same protocol and interfaces to communicate with the top-level unit.

Further in addition, it may be advantageous but not mandatory, if the top-level unit receives a specific IP-address used by this additional unit. That way, the information flow between the top-level unit and the individual additional unit will only occur on the particular channel and over a specific IP-address instead of sending out the information over the channels and having the need for each additional unit to check if the information received is intended for this particular additional unit.

According to a yet another embodiment of the present invention, a method of composing a control loop application system is provided. The method comprises the steps of a top-level unit and/or at least one additional unit to undergo the process of pre-certification, and a combination of the pre-certified top-level unit and the at least one pre-certified additional unit to be arranged in a stacked configuration to form a control loop application system with pre-certified units.

In a further preferred embodiment of the present invention, the control loop application system can be a safety-critical system have safety-critical software configured to operate on a certified hardware device. A safety-critical system may be an airborne safety critical system, or a ground-based aviation support system, for example. The device may, for example, be an instrument panel or display unit, such as may be installed on an aircraft. Under the present approach, an operator and template database may be generated that defines operators and templates. Each operator may have an operator identifier, and generally represents at least one of a logical manipulation used in the safety-critical software, a mathematical manipulation used in the safety-critical software, and a manipulation of operands used in the safety-critical software. Generally, each template may have a template identifier, and represents at least one of an input channel of the safety-critical software, an output channel of the safety-critical software, and an abstraction of a concept and computational functionality of the safety-critical software. An abstraction may be useful for logic and/or concepts not naturally represented as an operator. In embodiments, each template may have at least one of an input field identifying behavioral properties of the template, and an output field identifying results of the template.

In yet another preferred embodiment of the present invention, the use of a pre-certified unit in a control loop application system is provided.

DETAILED DESCRIPTION

Figure 1:
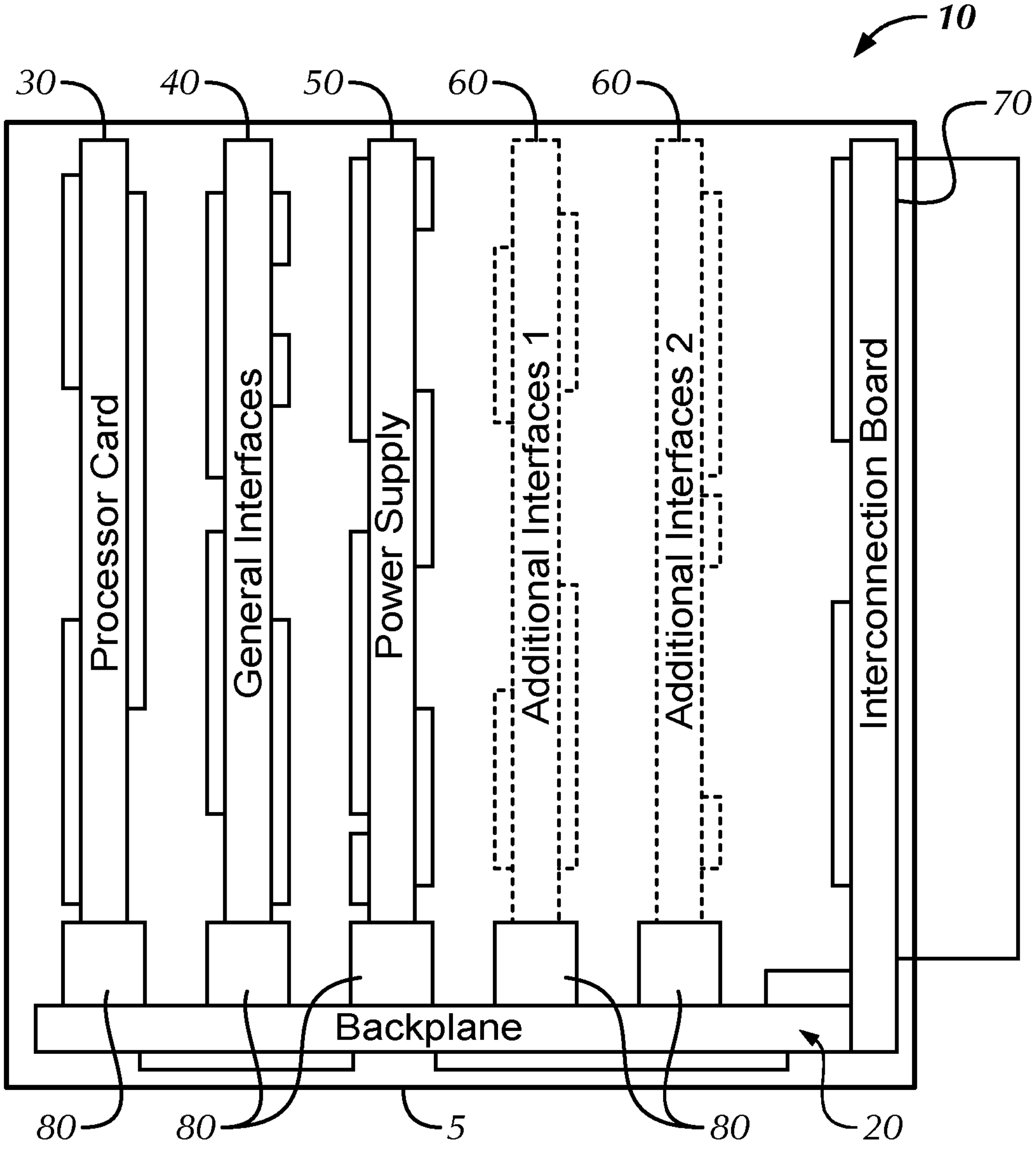
FIG. 1 illustrates a system according to the prior art using a backplane setup to install CBA's.

The following description is of the best currently contemplated mode of carrying out exemplary embodiments of the invention. The description is not to be taken in a limiting sense, and is made merely for the purpose of illustrating the general principles of the invention. Embodiments described are from avionics systems since these systems are considered to uphold the highest level of safety requirements, but it should be appreciated that the present approach may be applied to safety-critical systems in other industries or even in critical systems in non-safety critical industries.

This description uses various terms that should be understood by those of an ordinary level of skill in the art. The following clarifications are made for the avoidance of doubt. A "control loop system" as used herein is the hardware components and software control functions needed for the measurement and adjustment of one or more variables that controls an individual process. This can include the physical components and control functions necessary to adjust the value of one or more measured process variables, usually to achieve a desired set-point or maintain the value within a desired range. The control loop system includes one or more process sensors, controller functions, and final control elements which are all required for controlling the process.

The term "safety-critical system" as used herein is a system whose failure or malfunction may result in one (or more) of death or serious injury, environmental harm, and severe damage or loss to property or equipment. This can include the hardware, software, and human aspects needed to perform one or more safety functions, in which failure of a safety function would cause a significant increase in the safety risk for the people, equipment, or environment involved. A safety-critical system employs one or more control loops, depending on the purpose of the system. Safety-critical systems are present in numerous industries, such as infrastructure (e.g., electricity generation and transmission), medicine (e.g., life support), automobiles (e.g., airbags, braking, steering), and aviation (e.g., air traffic control, avionics, flight planning, navigation, engine control, and life support).

The term "Top-level unit" as used herein is a unit which performs the controlling function and although the term top-level is used, the entire system can be turned upside down, such that the "top-level unit" is placed in the bottom of the stack instead of in the top of the stack, or even in the middle of the stack. The actual position of the "top-level unit" in the stack will not change its function and functionality.

The present approach may be employed in a wide variety of industries having regulations and certification requirements on control loop systems. The embodiments described herein are made in the context of aviation systems and avionics (the electronic systems used on an aircraft). Various regulatory bodies require that any aviation system included in an aircraft meet specific regulatory requirements and standards before certification. Generally, regulatory requirements and standards are concerned with the approval of software and airborne electronic hardware for airborne control loop systems (e.g., autopilots, flight controls, engine controls). This includes systems that may be used to test or make aviation systems, e.g., hardware or software to be installed on an aircraft. In the United States, for example, the FAA Aircraft Certification Service develops the policy, guidance and training for software and airborne electronic hardware that has an effect on an aircraft. Of particular relevance are the guidance documents DO-178C for software and DO-254 for hardware, which apply to airborne systems. These regulations impose significant requirements for certification, and the certification process alone is considerably expensive and time consuming. Aviation system design is a complicated, lengthy, and expensive process. The costs of certification, as well as the risk of failing certification, are significant challenges facing the design and deployment of safety-critical systems.

An avionics system is a combination of hardware and software, as used in aerospace or space for safety-critical functions. Safety-critical avionics systems are deployed in aerospace to control key aspects of the aircraft, such as the instruments of the pilot, the motors, the flaps, the rudder and the wheels. Many auxiliary safety-critical systems are developed to support these, such as position sensors, altitude measurements, etc.

What makes safety-critical systems special relative to critical electronic systems in non-safety critical industries, is that safety-critical systems are deemed so critical that they need to be proven correct before first use, because any malfunctioning equipment has a high probability to cause injury or loss of life. Safety-critical industries are aerospace, space, trains, cars, some of the medical equipment, and parts of nuclear facilities. Before an avionics system is used, it must be certified before government agencies, and shown to comply with the applicable standards. At the most abstract level, these standards indicate acceptable error rates. For instance, the probability that a single event can upset the key instruments of an aircraft pilot must be shown to be less than 1 in a billion. In-depth safety analysis methods will be used to statistically prove this probability for hardware based on known component failure rates and providing hardware redundancy measures to overcome single event upset, and software will be designed to work around identified vulnerabilities of the hardware. The software itself will be developed according to rigorous principles. Compliance to these guidelines is mandated and checked by the government, such as the FAA in the USA and EASA in Europe.

Safety-critical systems are always hard real-time systems, in the sense that they must respond in a predictable time, every single time. Software design goes to great lengths to ensure that under all possible circumstances, the system responds in the predefined time. The safety critical systems do not necessarily need to respond fast, they simply need to respond on time. For some avionics systems, for instance some control aspects inside the engine, the allowed response time is 1 millisecond. For other avionics systems, the response time can be as much as one hundred milliseconds. In both cases, the response may never be later than the required response time.

Because of these properties, safety-critical software can never be developed in isolation of the hardware. The performance and capabilities of the software is strongly linked to the hardware, the hardware must provide safety features to protect the software, and the software must be designed to take advantage of these features. At the same time, the software must monitor and work around any vulnerabilities that are present or may occur in the hardware.

As such, certification is always performed on a complete system, and never on hardware or software in isolation.

Certification has many aspects, including the compliance to minimum operational standards and other guidelines. There are also guidelines for the design and development of hardware and the same applies for software. These guidelines provide design assurance levels (DAL), from E (no oversight) to A (highest criticality). Our proposed method is applicable to all criticality levels.

Currently any change in either the hardware or in the software automatically triggers complete re-certification, unless a change analysis can prove there is limited or no impact. In this case, only a limited testing and re-certification was deemed necessary. In the prior art systems, changing something small like a hardware resistor on the board was considered acceptable. However, typically a design change would always go beyond the simple change of a single component and would thus often not be considered as a change with limited or no impact, resulting in the need to re-certify the entire system.

Adding to the certification complexity is the fact that the complexity of safety-critical systems is rising quickly. Studies show that the complexity of aircraft onboard avionics doubles on average every 2 years. This enables safer ways to operate the aircraft, address new threats, as well as higher efficiency of the aircraft, or provide new capabilities to an aircraft, such as unmanned aircraft operations.

On the one hand, the technology to accommodate the requested increase in functionality, safety, user-friendliness and complexity is available, however, would automatically result in a mandatory re-certification which is time consuming and costly. To cope with all of this complexity, the common strategy in the industry so far has been to re-use as much as possible the existing instruments, to overcome the massive effort to obtain certification for new or modified instruments.

From the view point of the industry, it is too time consuming and expensive to develop new on-board computers and go through the entire certification process. Although it is thus not the ideal situation, but in practice, the avionics industry typically decides to re-use the entire instrument, rather than adapting the computers with latest available hardware technology and providing the aircrafts with the latest available technology. This is why many aircrafts use the same instruments, which are often outdated, and unfortunately, often aircrafts use instruments that are not ideal for that particular aircraft, at a certain point in time get outdated, but are good enough and most often the only cost-efficient way of obtaining the instruments within the relatively short timeframe it takes to bring a new aircraft to market. This approach also results in a very slow evolution in instrument features for the established instruments, although the technology is often available, but just did not go through the required certification process.

Due to the complexity of the hardware/software interaction to achieve the required safety levels for an implementation, and the need to verify all of the code against the applicable certification requirements, currently, the reused instruments are usually very narrowly tuned to their intended function.

The present invention solves these and other problems by advantageously providing for a control loop system or computer which can be built together by using additional units which individually or in combination with a top-level unit went through the mandatory testing phase, and which can be combined without the need to re-certify the new combination. In order to make this possible, the different units need to be able to work together with the top-level unit without the need to embed the function of each unit and its position in the stack in the top-level unit when compiling or putting together the computer. The system, once stacked together, needs to be able to detect upon starting the position of the different additional units 521-524, their function in the computer and the way to address them to allow communication between these additional units and the top-level unit. Therefore, a method is provided to allow the identification of how many additional units there are in a specific configuration, to identify in which position in the stack each unit is placed and to identify which protocol and/or interface is needed to address these units. Having the possibility for the modular system to identify the interface to use, and how to address it, will allow the modular system to have a large number of slave busses on the same communication buss, while only using those slave busses when needed, depending on the modular system build for a specific application. It is even possible with the present method to foresee multiple and identical additional units, while still allowing them to be addressed in a unique way after the identification process has finished. This method will allow a modular system to be put together where power supply and all possible interfaces are foreseen in the top-level unit only, such that the top-level unit will be able to provide power and communication to the additional units via a specific communication buss using a specific interface which is defined by the additional unit, and only a limited number of interfaces need to be provided on this additional unit, having the result that each module or unit is interchangeable without effecting the other units. This interchangeability without affecting the other units is an advantage which cannot be found back in the prior art systems where it is always the case that an entire system needed to be built together and pre-programmed beforehand, and if one component fails, the entire system needed to be replaced, which can be very expensive.

Although the preferred way of designing the top-level unit and the additional units is with a power supply in the top-level unit alone, it may however be possible for a particular unit to foresee additional power supply for the particular unit when the power usage for this unit is too high to extract from the top-level unit alone. Once all additional units 521-524 are designed, with or without the additional power supply, each additional unit can get a certification in combination with a generic (top-level) unit 520, 620. Such an individual combination can be considered as a new individual basic computer 500 which went through the certification process and is considered safe to use. Once certified, the combination of the generic unit 520, 620 with the specific additional unit 521-524 can then be combined with one or more additional units to form a new custom tailed system or computer 500. However, there is no need for this new combination to undergo the certification process for this particular set-up, since each individual unit in combination with a generic unit was already pre-certified and considered safe. The ability to use the same generic top-level unit 520, 620, which will typically hold the power supply, and stacking additional pre-certified units to form a custom tailed computer 500, will result in making the re-certifying redundant since no change is needed to the specific additional unit, or to the top level unit. There is no need to pre-program the function of all the additional units in combination with their position in the stack and the way they can be addressed, since this is detectable by the method of the present invention and as a consequence thereof, each unit will be addressable by the top-level unit, regardless in which position they are placed in the stack when bringing them together to form the required computer for a specific airplane. Again, this provides the advantage that any combination in a stack is possible, from the exchangeability of the different units to the position of the units in the stack. Any combination of units is possible, without the need to preprogram (and thus certify) each of these combination of units and its position in a stack so that these combinations are useable in an airplane. This is extremely beneficial to the speed of development and will improve the time to market drastically. Since all additional units are pre-certified, one can simply create an endless possibility of combinations which don't need re-certification when brought together to form a new system, where the prior art solutions will still need to get a certification for a new combination. If a new additional unit is created, or an update to an existing unit is needed, only this additional unit in combination with a generic unit will need to undergo the certification process, which is easier and faster than having the entire computer with all additional units (including the new one) to undergo the same certification process. Additionally, in comparison with the computers of the prior art, it is possible to limit the number of completely configured computers and only provide for the need to have a limited number of pre-certified units in stock. When a specific unit in a stack needs to be replaced, it is possible with the present invention to only replace this unit, without affecting the other units in the stack. That way, it is not necessary to have a large number of different types of complete computers in stock, but only a number of the additional units of a stacks need to be available. This is especially beneficial if e.g. an airliner has a large fleet of different airplanes, and each type of airplane has its own specific computer configuration. When using the present invention, the airliner will not need to have a stock of complete computers available for each type of airplane, such that, in case of a defect, a quick repair is possible. The units according to the present invention are typically the same for the different type of airplanes and are typically less expensive to keep in stock than an entire computer. Instead, with computers of the prior art, the entire computers of all the different airplanes need to be kept in stock if a similar level of serviceability is required. Therefore, a reduction in investment on spare parts is accomplished due to the interchangeability of the units over the entire range of different airplanes.

As mentioned above, in order to prevent that for each newly compiled computer 500 a full certification process is needed, as was the case in the prior art systems, a number of combinations are certified, whereby each unit will have a specific function or perform a specific task, and will thus have specific components installed on the CBA 530, 540, 550 to perform the specific function determined for e.g. an avionics application. Once each of these units in combination with a top level unit is certified, they are interchangeable without the need to certify the system in other configuration setups again. This is possible because each unit—together with a top-level unit 520—will function as a stand-alone system, in which each individual unit is individually addressable by the top-level unit 520 and the power supply for all units in a stacked configuration is foreseen in the top-level unit 520. Combining one of the certified stand-alone systems with another certified stand-alone system will not require for synergies between the different systems and there is no interaction needed between the different units. As will be explained further below, each system will be independent of another system and will have no impact or influence on another system in the stack. So, if a specific stand-alone unit is certified, there is no need to re-certify the combination again if it is built into a new system due to the fact that there are no synergies needed between the different units.

FIG. 8A to 8D illustrate a selection of possible setups or combinations of units used for certification purposes which, once they are certified can be combined or interchanged.

Figure 8A:
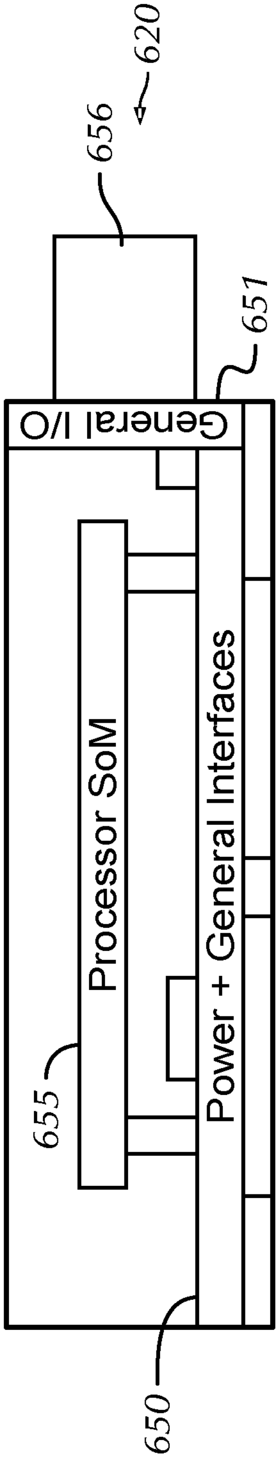
FIG. 8A-8D illustrate a number of different computers with basic functionalities which are to be certified before being able to be used in an embodiment of the present invention.

FIG. 8A represents the basic system containing only the top-level unit 620. Such a setup represents the smallest possible computer with a minimum set of functions and interfaces. The top-level unit 620 may contain the processing unit or System on Module (SoM) 655 with storage, a carrier or CBA 650 with redundant power management and a combination of general interfaces which can potentially be used by the top-level unit to communicate with additional units. In addition, the top-level unit 620 comprises interfaces 656 such as Gigabit Ethernet, RS-485, ARINC 429, CAN or General Purpose Input Output (GPIO) which provide for a connection with the outside environment, e.g. the airplane which it needs to control. Such a basic computer can e.g. be used for functions as engine control or an air data computer which processes external sensor data.

Figure 8B:
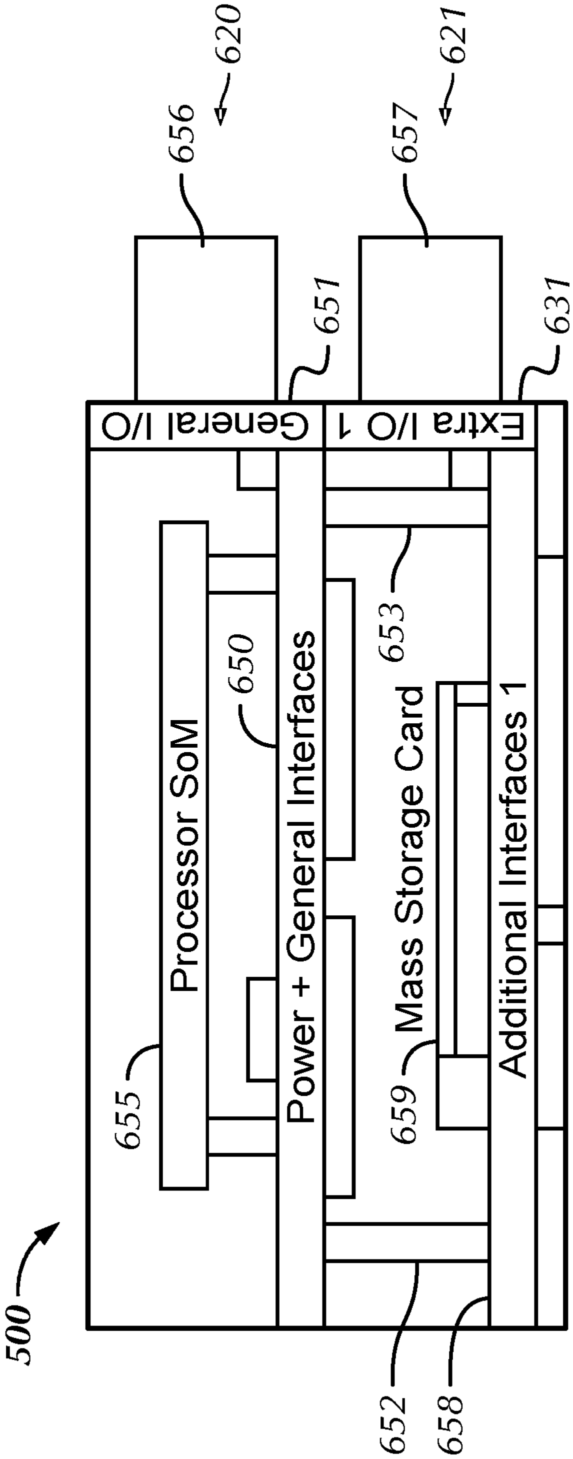

FIG. 8B is an example of a mass storage and communication computer 500 combining two units. The top-level unit 620 is the same unit as that of the basic system, while the second level unit 621 contains the typical interfaces and functions needed for mass storage and communication. The interconnection board or CBA 658 of the second level unit 621 typically will contain a mass storage card 659 and may further contain interfaces 657 such as Wi-Fi, Bluetooth or Cellular interfaces to also communicate with the outside environment. Additionally, at least one interface 652 is provided between the CBA 658 of the second level unit 621 and CBA 650 of the top-level unit 620, which will allow for a communication and power supply between the top-level unit 620 and the additional second level unit 621. Also, at least one connector 653 is foreseen between the CBA 650 of the top-level unit 620 and the CBA 658 of the second level unit 621. This connector 653 will allow for the detection of the number of additional units in the stack and the position in the stack of the additional unit. Alternatively, two connectors 653 can be foreseen between the CBA 650 and the CBA 658, a first one to allow for the detection of the number of additional units in the stack and a second one to allow for the detection of the position of each additional unit in the stack.

Figure 8C:
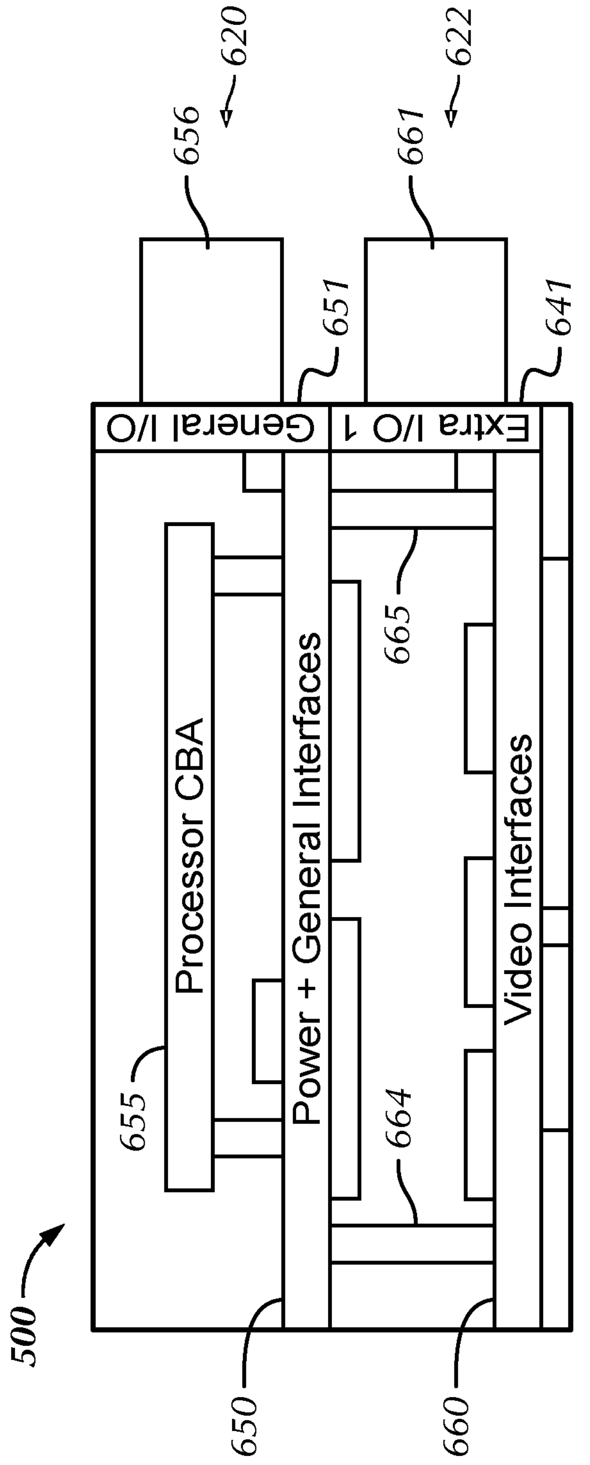

FIG. 8C is an example of a video system having two units of which the top-level unit is again the same as that of the basic system, while the second level unit 622 is able to generate e.g. EICAS, MFD or PFD graphics output by using e.g. two video inputs and two video outputs 661. Again, at least one specific interface 664 is provided between the CBA 660 of the additional second level unit 622 and the CBA 650 of the top-level unit 620, which will allow for a communication and power supply between the top-level unit 621 and the additional second level unit 622. Also, as was the case with the example of FIG. 8B, at least one connector 665 is foreseen between the CBA 650 of the top-level unit 620 an the CBA 660 of the additional second level unit 622. Again, this connector 665 will allow for the detection of the number of additional units in the stack and the position in the stack of the additional unit. Alternatively, two connectors 665 can be foreseen between the CBA 650 and the CBA 660, a first one to allow for the detection of the number of additional units in the stack and a second one to allow for the detection of the position of each additional unit in the stack.

Figure 8D:
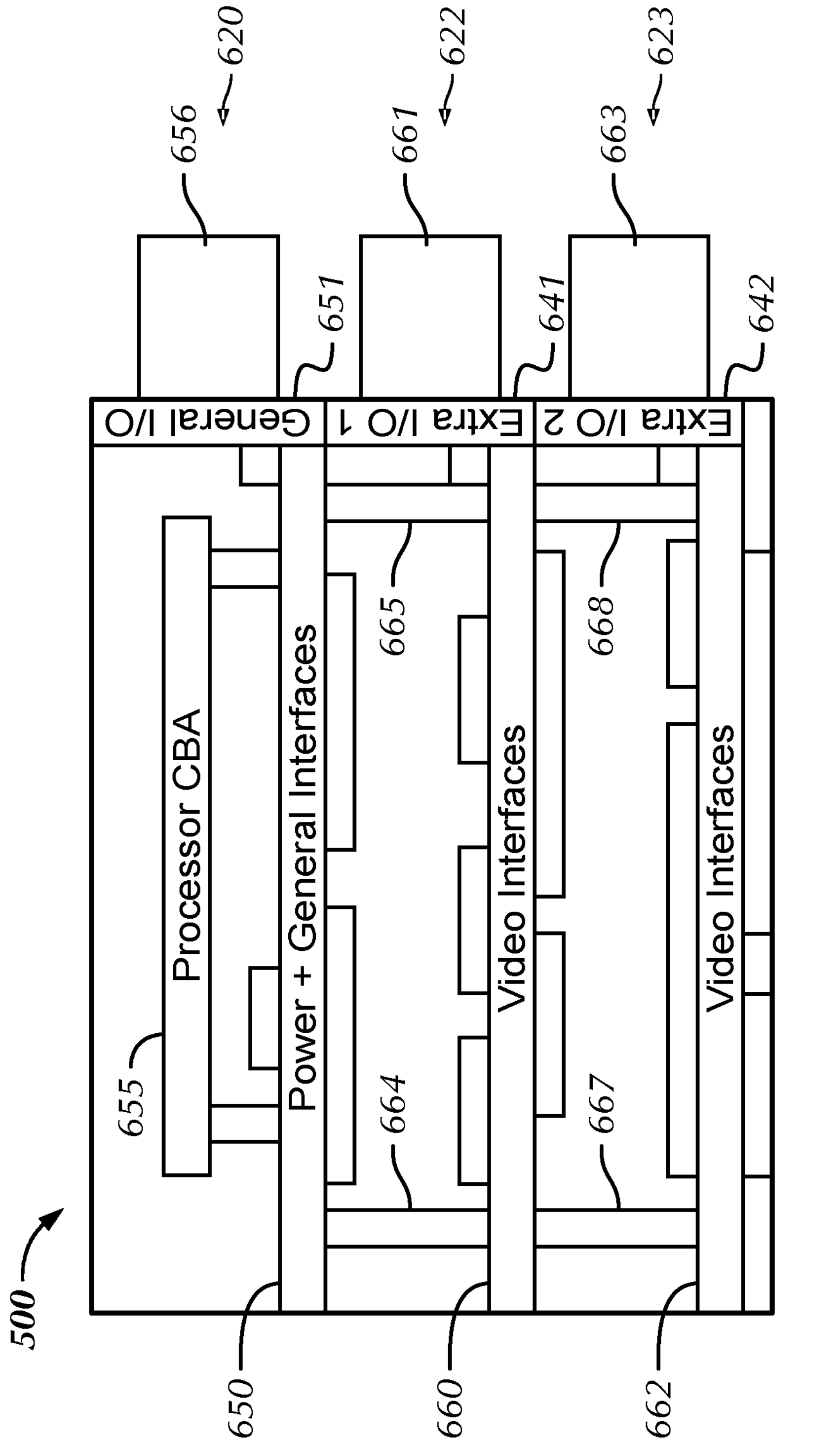

An additional video interface unit 623 can be added to the example of FIG. 8C by adding one or more additional units, which are the same or similar as the additional second level unit 622 of FIG. 8C if extra video channels are needed. E.g. a three level video system as shown in FIG. 8D will have four camera inputs 661, 663 and could be used as a video concentrator which collects video input data from multiple camera streams and e.g. send it to a central computer via the top-level unit 620 for further processing. In FIG. 8D, at least one specific interface 664 is provided between the CBA 660 of the additional second level unit 622 and the CBA 650 of the top-level unit 620 which will allow for a communication and power supply between the top-level unit 621 and the additional second level unit 622. Also, at least one connector 665 is foreseen between the CBA 650 of the top-level unit 620 and the CBA 660 of the additional second level unit 622. This connector 665 will allow for the detection of the number of additional units in the stack and the position in the stack of the additional unit. Between the additional second level unit 622 and additional third level unit 623, a similar or the same at least one specific interface 667 is provided between the CBA 660 of the additional second level unit 622 and the CBA 662 of the third level unit 623 which will allow for a transfer of the communication and power supply between the additional second level unit 622 and the additional third level unit 623, which is originating from the top-level unit 620. Also, at least one connector 668 is foreseen between the CBA 660 of the additional second level unit 622 and the CBA 662 of the additional third level unit 623. This connector 668 will, together with connector 665 allow for the detection of the number of additional units in the stack and the position in the stack of the additional unit.

Alternatively, the connectors 665, 668 between the CBA 650, the CBA 660 and the CBA 662 can be duplicated as is also possible in the example of FIGS. 8B and PC, a first one to allow for the detection of the number of additional units in the stack and a second one to allow for the detection of the position of each additional unit in the stack.

Although in the example of FIG. 8D, the additional units 622 and 623 are similar in function or can be even identical, the third level unit 623 can be a different kind of additional unit, with a completely different function and layout of the second level unit 622. Also, although not shown in the drawings, a fourth, fifth, sixth, etc. level unit can be added to the stack.

Another system to certify is an edge system (not shown). Such a system is used to collect sensor data on a remote location and send this data to a central computer. These systems could come in any size depending on the number of required interfaces. In some areas or locations on earth and for some purposes, only a few GPIO, CAN or ARINC-429 interfaces will be required. On these locations the basic system will be sufficient. On some other locations, more than 100 interfaces will be required. At those locations the edge system might be a three or even four level system.

In any case, the total system will only have two types of units: the basic unit and the edge unit. Depending on the needs, this edge unit could be repeated multiple times in the system.

Other systems are also possible and may be built with specific components depending on the functionality intended for this particular unit. Important to realize is that each new system which is certified, will always be certified in combination with a top-level unit 620. Each additional second-level unit can be provided with its own dedicated I/O interfaces to be able to receive inputs and send out outputs without the need to use the I/O interfaces of the top-level unit 620. Each second level unit will also be provided with at least one dedicated interface to provide for a connection between the top-level unit 620 and the addition second level unit to allow power supply and a communication between the top-level unit 620 and the additional unit.

So, to be able to create a new functional system according to the present invention, it is necessary to test and comply with the certification requirement the top-level unit as stand-alone unit, and each combination of a top-level unit with at least one unique additional second level unit. Although not necessary, it is also possible to certify a multi-layer combination, meaning a combination of more than one additional unit, and have them certified as a complete unit. Although this is possible, this is not necessary, as long as each additional unit in the combination is certified in combination with a top-level unit, and with the condition that there is no synergy between the additional units. If however for some reason, a synergy exists between the additional units, then a certification is needed for a system having a top-level unit and the additional units between which synergy exists.

Once the different types of systems are certified with the specific components and layouts for each system, these systems can be used in a modular approach to construct hybrid systems. Such a hybrid system can be a combination of any of the above described exemplary systems. If e.g. a computer is required having a unit with mass storage and video capabilities, it is straight forward to build a three-level unit containing a basic unit as shown in FIG. 8A, a mass storage unit 621 as shown in FIG. 8B and a video unit 622 as shown in FIG. 8C. Since the units are certified independently from each other, and the combination requires simply to stack the units (see below) without the creation of synergies between these units, almost all, if not all, certification credits are reusable from the certification of the mass storage system of FIG. 8B and the video system of FIG. 8C. The same principle can be used when certification is reached for a multiple level variant, e.g. as the example of FIG. 8D, and which is downsized when used in a specific setup with less requirements.

In order for airborne electronic systems to be certified, they have to comply with several certification standards. Currently, the two most important ones for hardware systems are the environmental qualification standard DO-160 and the Airborne Electronic Hardware design certification standard DO-254, ED-80 or AMC 20-152.

As was also the case for the prior art certification process, the certification process of the present invention depends on the chosen components, usage of these components, the architecture in which these components are used and the usage of programmable logic. However, in the present invention, when the certification process is implemented on unit level, all certification artifacts can be reused for the system in which the unit will be integrated. Therefore, it is important that requirements are captured on the level of the unit and that no change in requirements is needed when integrating the unit in different systems.

For example, when the basic system has gone through full AMC 20-152/DO-254/ED-80 certification, other systems can fully reuse this certification data because the function provided by this particular unit is identical in each system in which it will be integrated.

For the environmental qualification it will be more complex to reuse qualification data because it will not always be possible to split the qualification to unit level. However, once qualification has completed on one system, most of the test results could be reused for other derived systems. The most important environmental tests are tests relating to power input, voltage spike/lightning susceptibility/ESD, induced signal susceptibility, temperature and altitude, fungus resistance, salt fog, RF emission/susceptibility and Vibration/Shock & Crash safety. Although these tests can change over time, depending on the requirements installed by governmental organizations, they are briefly explained below and indicated to what extend they are affecting the need to re-certify or not.

However, the circuitry for the power input is part of the top-level unit and is identical for all systems in the family. Therefore, reuse of the qualification data is possible if the power input remains the same for all systems.

The circuitry to protect the system against lightning, voltage spike or ESD is part of the interface circuit. When reusing a unit with a certain interface, the system will provide the exact same protection against these surges as the original system. Therefore, reuse of the qualification data is possible in this case. If a different interface is used, only some or possibly none of the qualification data can be reused and recertification may be necessary. However, this will then result in a new unit, with the same functionality as the comparable unit, but with the difference that a different interface is used between the top-level unit 620 and this additional unit to provide for the communication and power supply between the units. A reason for certifying multiple units with the same functionality but with different interfaces can be that a specific type of interface is over-dimensioned for the function this unit will have in a specific type of airplane. E.g. a unit with a 2× Gtr Lanes interface can be certified and a unit with the same functionality but now with a 4× Gth Lanes interface can also be certified. In this example, not all tests need to be repeated to become certified. Only this particular test to check if the system is protected sufficiently against lightning, voltage spike or ESD will need to be repeated.

The induced signal susceptibility depends on the connector of the system and the EMC protections of the interfaces. When reusing a unit with a certain interface and connector, the system will provide the exact same protection against induced signal susceptibility as the original system. Therefore, reuse of the qualification data is possible in this case. If a different interface and/or connector is used, only some or possibly none of the qualification data can be reused and recertification may be necessary.

The resilience against temperature and altitude depends on the choice of the components, the usage of these components (derating) and thermal design. All these factors remain the same when a unit is reused in another system.

Salt fog is testing the effect of accelerated corrosion. The fungus test on the other hand will verify if the system is adversely affected by fungi. The result of both tests depend on the used material of the connector and the housing. Since this will not change between different variants of the system, the results from these tests could be reused.

The susceptibility against external RF emission depends mainly on the design of the housing of the system. The same is valid for RF emission of the unit itself. Since the design of the housing can change between system variants, some delta qualification testing will be required. Such delta qualification testing will take less time and effort than a full qualification testing. Further, because the mechanical design is similar and differs only in size, the risk on failure can be considered as low, which makes it worthwhile to perform such delta testing.

The resilience against vibration and shock depends on the choice of the components, the fixation of these components and the overall mechanical design. Since the design of the housing might change between system variants, some delta qualification testing will be required. Because the mechanical design is identical apart from the size, the risk on failure can be considered as low, which makes it worthwhile to perform such delta testing.

Once certification of each system is done, it will be easy to use these systems as building blocks to create a new computer as per the specifications of the client in a modular way. Since the certification can be reused, or only some delta testing is required, it is possible to build a computer which is a low SWaP solution, which is cost efficient, which can be brought to market a lot faster than the current prior art systems, and which allows for a less expensive spare parts policy.

Figure 2:
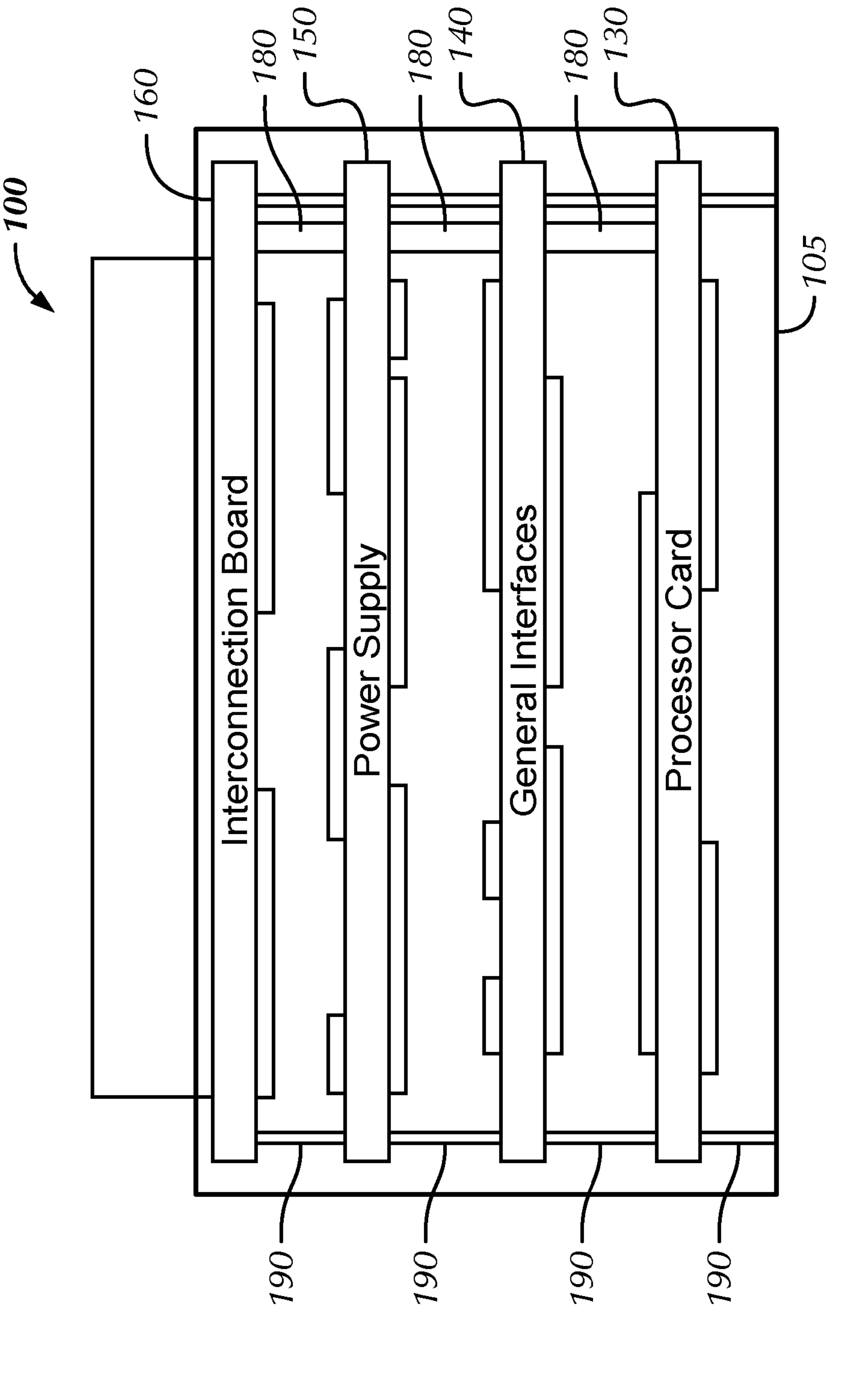
FIG. 2 illustrates another system according to the prior art using a stacked configuration layout of the CBA's.
Figure 5:
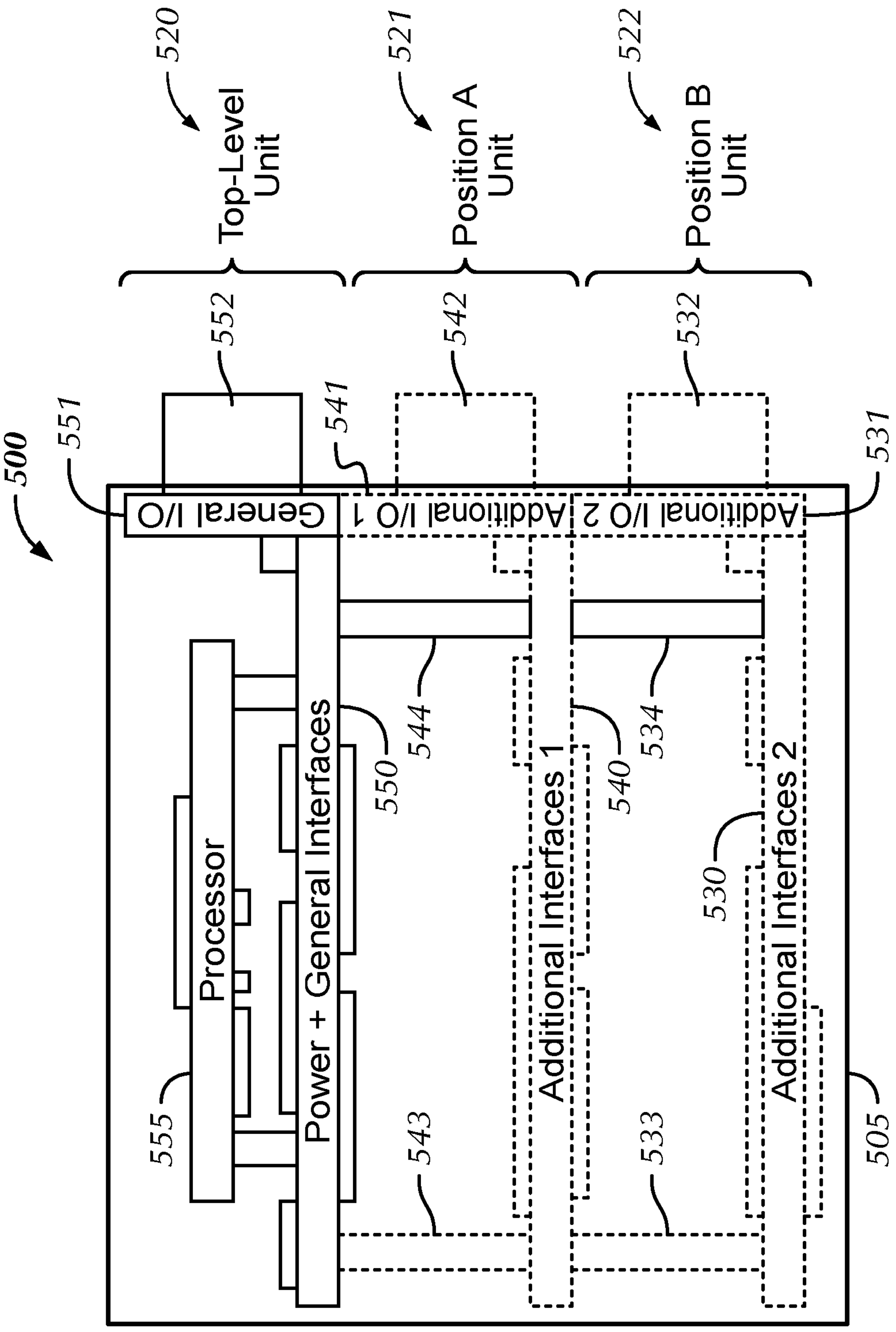
FIG. 5 illustrates a layout of an embodiment for a safety-critical system according to the present invention. The top-level unit is shown in the top position, while the additional layers are stacked under the top-level unit.

FIG. 5 shows the internal layout of a computer according to the present invention. To avoid the downsides of a backplane layout as illustrated in FIG. 1, a similar stacked configuration as shown in FIG. 2 is used. In the illustrated computer 500, three layers are used to build a computer for a specific control loop application and more particular for an airborne application or a safety critical application. The top-level unit 520 comprises a base board or CBA 550 with power supply components to provide power to the entire computer, a mezzanine card 555 holding a processor or System on Module (SoM) and its corresponding interconnection board 551. Other options for such a top-level unit 520 are possible, such as a combination of a carrier board with one or more mezzanine cards. The interconnection board 551 on its turn is holding the I/O connectors 552 required for this particular top-level unit 520. Regardless of the specific layout of a top-level unit 520, it is important to realize that there is always a carrier board with power components 550 supplemented with one or more mezzanine cards 555, and an interconnection board 551 holding the I/O connectors 552 for the top-level unit 520.

When a specific computer requires additional interfaces, an additional layer or unit 521, 522 is added to the top-level unit 520. Each additional layer comprises an individual CBA 530, 540 on which specific components can be added dedicated to the specific task for which the layer is intended. If more specific tasks can be allocated to the same additional unit, additional components specifically for this additional task will be added to the same unit. Again, each additional layer or unit 521, 522 may have a dedicated interconnection board 531, 541 holding the specific I/O connectors 532, 542 needed for this particular layer. The additional units 521, 522 are connected to the top-level unit (or to each other) by the use of spacers (not shown) on their four corners, similar to the stacked configuration as illustrated in FIG. 2 to provide for the robustness of the total system 500. Additionally, at least one first stack connector 533, 543 (similar to the connectors 652, 644 and 667) is placed in between two layers or units to provide communication between the different units, being the top level unit 520 and the at least one additional unit 521, 522. The stack connector 543 may be provided with one or a selection of different types of interfaces such as but not limited to I2C, serial peripheral interface or SPI, Quad Serial peripheral interface or QSPI and Peripheral Component Interconnect Express or PCIe, which will allow the top-level unit to communicate with the other additional units 521, 522. Using the first stack connectors 533, 543 allows for the different units to implement or use only the specific communication bus that is required for this particular unit or layer. It should be understood that the interfaces are a connection coupling a master device which is installed on the top-level unit 520 with slave devices installed on the additional units 521, 522.

Each additional first stack connector 533 bridging between the additional units may at least be equipped with one main type of interface, e.g. a I2C slave interface. This will allow the top-level unit 520 to communicate with each additional unit using the e.g. I2C and a unique position address (see below). Using the e.g. I2C interface will allow the top-level unit to detect which additional interfaces are used in the first stack connector 533 and identify what other interfaces are supported by the additional units 521, 522. It is however possible for the first stack connector 533 to only contain the main interface being in this example the I2C interface.

If a SPI interface is available, it can work in a single mode, while in case of a QSPI it is able to work in a quad mode. Selecting between a SPI or QSPI will depend on the required bandwidth. The PCIe will be operable between 1 and 4 lanes, a selection which will be made again depending on the required bandwidth. Currently available technology allows up to a bandwidth of 5 GT/s per lane. All of this kind of information will be made available by the additional units 521, 522 using their main interface (e.g. I2C) such that the top-level unit 520 can identify which kind of interface it can use to communicate with which additional unit 521, 522.

For instance, if a particular layer or unit requires only a low bandwidth between the top-level unit 520 and the particular additional unit 521, e.g. I2C can be used as a communication bus by the stack connector between the top-level unit 520 and the additional unit 521. For the majority of the applications, such a communication bus will be sufficient. If this is sufficient for the particular application, the computer of the present invention does not require additional (costly) interfaces. However, if the required bandwidth needs to be high to provide a specific additional unit 522 with the required information, another type of communication bus which is also part of the first stack connector 533, 543 can be used, such as e.g. a 4 lane PCIe gen 2 communication bus. While this would be more costly, the cost will only occur in applications where this particular functionality is needed.

Additionally, at least one second stack connector 534, 544 can be installed between the units and has the function to allow the top-level unit 520 to automatically detect how many units or layers 521-524 there are in the total system 500 and for each additional unit 521-524 to detect its position in the stack as will be discussed further in relation to FIGS. 6A, 6B, 6C and FIGS. 7A and 7B. This is important since each additional unit will generate a specific slave address which will then be used by the top-level unit to send out communication over the busses, and by each additional unit to extract the information intended for this particular unit.

The first stack connector 533 and second stack connector 534 are connectors which consists of a first (e.g. female) part 533', 534' being installed on one side of the CBA of the additional unit 522, while a second (e.g. male) part 533", 534" is installed on one side of the CBA of the additional unit 521. When stacking these two additional layers on top of each other, the two parts 533', 534' and 533", 534" will be aligned and the female part will be pushed inside the male counterpart thus connecting the two halves with each other and establishing a connection between the two additional units.

Similar, the stack connectors 543 and 544 are connectors which consists of a first (e.g. female) part 543', 544' being installed on one side of the CBA of the additional unit 521, while a second (e.g. male) part 543", 544" is installed on one side of the CBA of the top-level unit 520. When stacking these two layers on top of each other, the two parts will be aligned and the female part will be pushed inside the mail counterpart thus connecting the two halves with each other and establishing a connection between the two units.

The same applies to the stack connectors of FIGS. 8B-8D, where the stack connecters are represented in a simplified manner, but where a male and female part of all connectors are brought together and thus connected to each other to establish the necessary connections.

In order for the top-level unit 520 to be able to communicate with the additional layers or units 521, 522 according to the preferred method of the invention, a number of steps are needed when starting up the modular control loop application system or computer 500. After providing power to the control loop application system, the next step is the detection and determining the total number of units 520, 521, 522 in the system by the top-level unit 520. The second step is allowing each unit 520, 521,522 to detect and determine its position in the stack and with the next step, use this position information by each unit 521, 522 to identify to the SoM or processor of the top-level unit 520 which unique I2C slave address to use according to the detected position in the stack. The top-level unit 520, and more particularly the SoM will know, by the number of detected units 520, 521, 522, and their position in the stack, which protocol to use and which unique I2C addresses to use to send out information to the additional units, and from which I2C addresses to expect to receive information from. The link between the position in the stack, and thus the position information, and the unique I2C slave address corresponding herewith is embedded in a library in the top-level unit and in each additional units. This will allow the individual units and the top-level unit to identify the necessary I2C slave address. So, which I2C addresses to use according to the number of additional units is embedded in the top-level unit and which I2C address to use depending on its position in the stack is embedded in each additional unit. When the top-level unit has identified the number of additional units in the stack and knows the location of the particular unit, it will identify which I2C slave address it will use, depending on the information provided in the library. E.g. a first additional unit located on position 1 in the stack will, according to the library embedded in the top-level unit and additional units, always use I2C slave address N° 1 to communicate with the top-level unit and vice versa. A second additional unit located on position 2 in the stack will always use I2C slave address N° 2 to communicate with the top-level unit and vice versa, the third additional unit located on position 3 in the stack will always use I2C slave address N° 3 to communicate with the top-level unit and vice versa, etc. Additionally, each additional unit and top-level unit will need to be able to identify its respective position in the stack in case there are two or more identical additional units located in the stack, because this will allow the top-level unit 520 and the additional unit to determine which offset needs to be given to which I2C address, so that direct communication to a specific unit is still possible over the identified I2C address, but now with an offset given to the address. Using the offset in combination with the specific I2C address will allow communication between the top-level unit 520 and this particular additional unit, without addressing the identical unit in the stack of this particular unit. Each additional unit will use this identified I2C address (with or without the offset) to send information (e.g. about its functionality, or unit specific data) to the top-level unit. Likewise, the top-level unit will thus know which specific I2C address (with or without the offset) to use to send over specific information for a specific additional unit, without the need to know the position in the stack. Although some of the above steps are described above as sequential steps, this is not necessary. The detection of the position and detecting how many additional units there are foreseen in the stack can be done simultaneously.

Figure 6A:
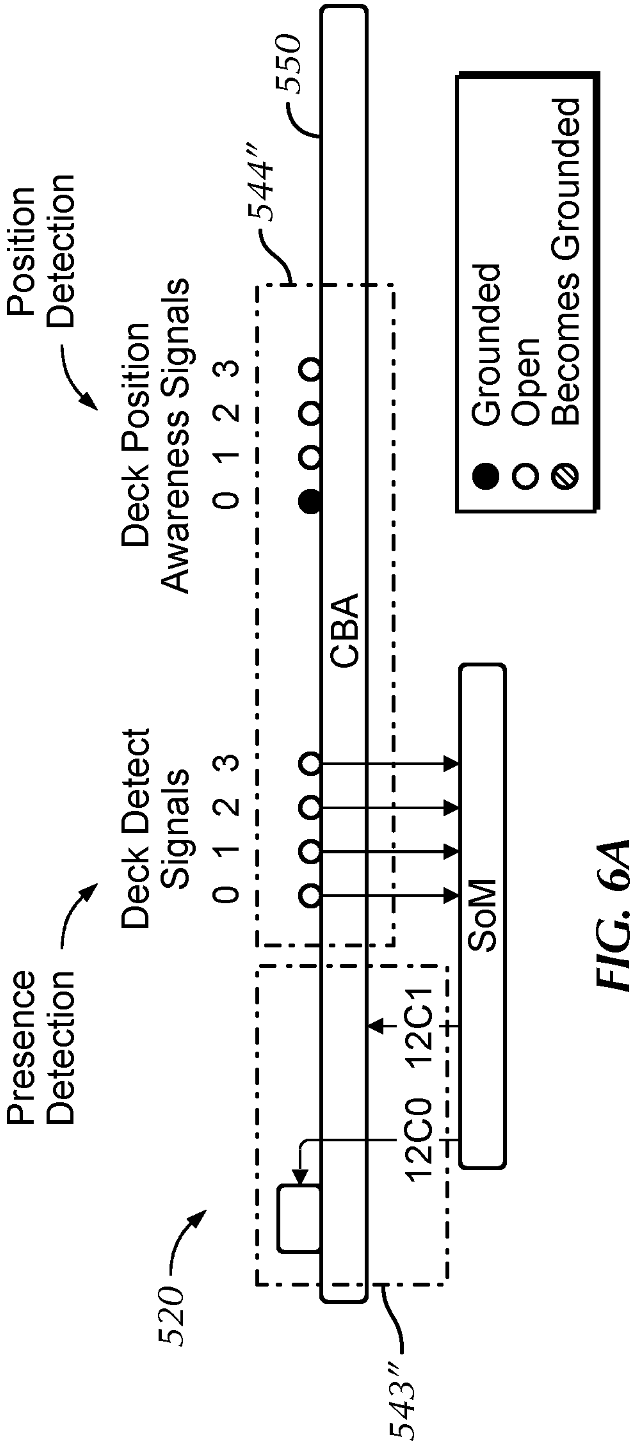
FIG. 6A shows a graphical representation of the internal layout of a stand-alone top level unit.
Figure 6B:
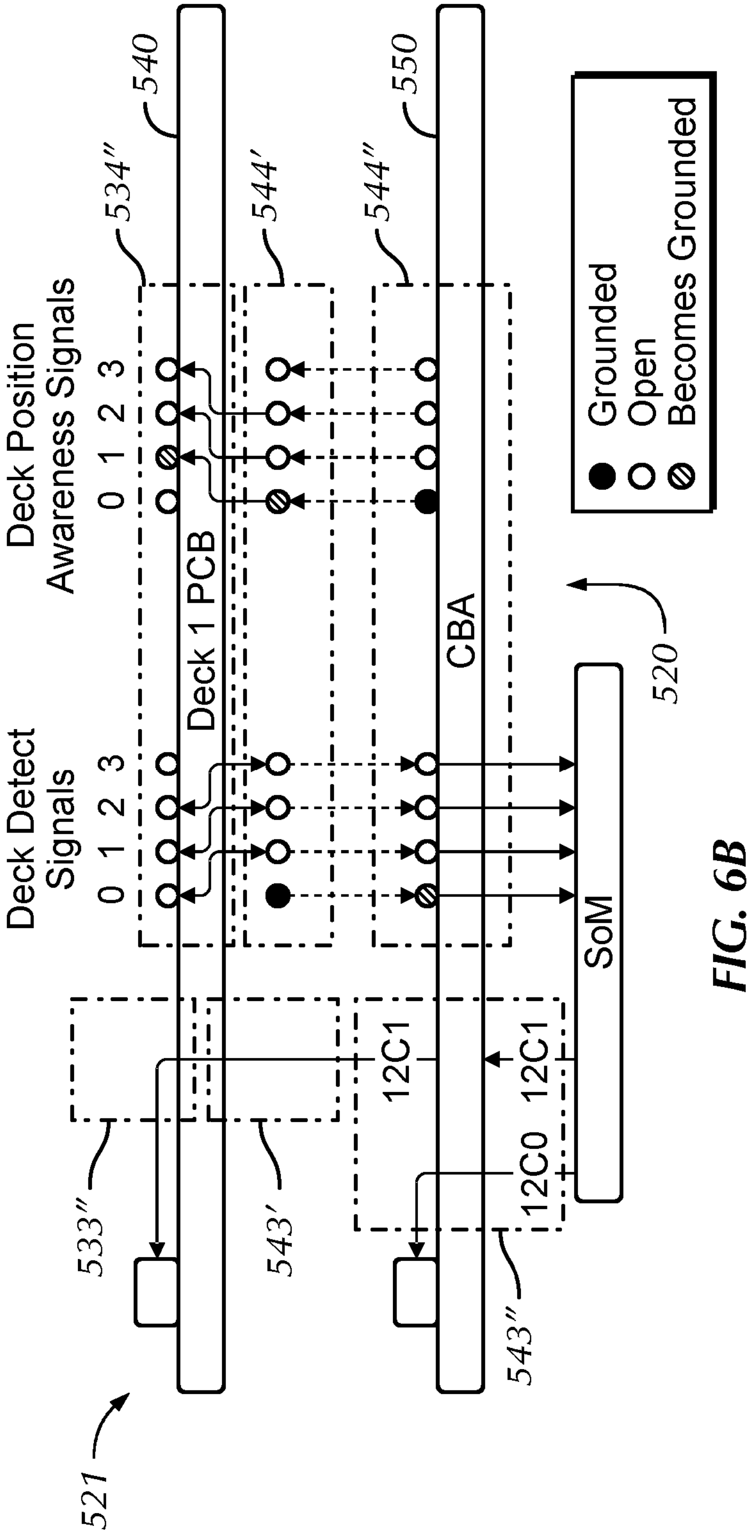
FIG. 6B shows a graphical representation of the internal layout of a stand-alone top level unit and one additional unit and how the stack connectors are connected.
Figure 6C:
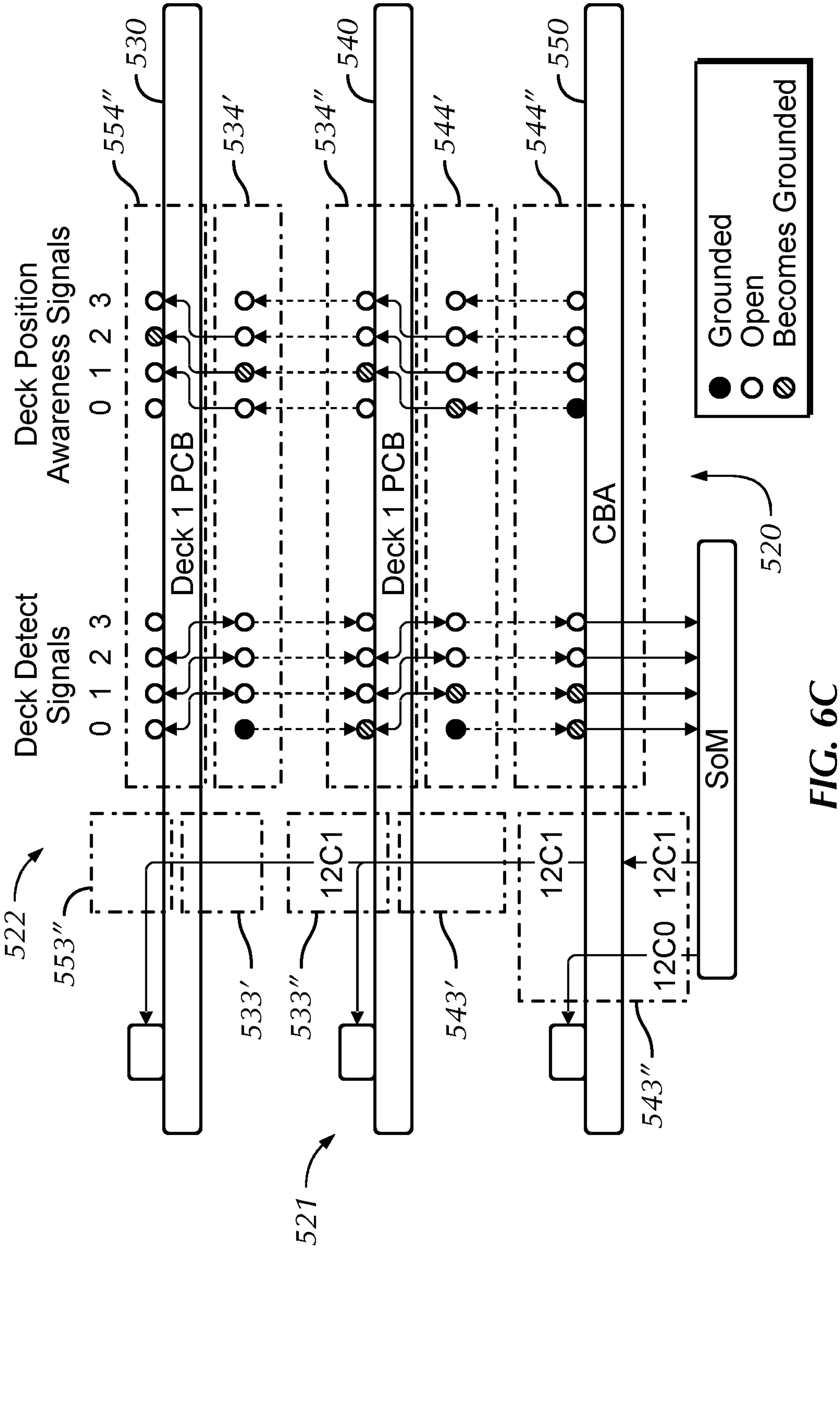
FIG. 6C shows a graphical representation of the internal layout of a stand-alone top level unit and two additional unit and how the stack connectors are connected. The top-level unit in the FIGS. 6B and 6C are located in the bottom position in the stack.

The above steps will be explained further using the FIGS. 6A to 6C, where FIG. 6A is a top-level unit alone, FIG. 6B is a top level unit and one additional unit and FIG. 6C is a top level unit and two additional units. Although not further shown, the above steps can be expended to even more additional units.

Starting with FIG. 6A and in analogy with the description of the connectors of FIG. 5, the male part of the connector 544" is foreseen on one side of the CBA 550 of the top-level unit 520, allowing for a female counterpart 544' to be plugged in, when an additional unit would be placed on the top-level unit 520. A first set of the male connector 544" is shown separate from a second set of male connectors 544", where the first set of the male connector is used to detect the position, while the second set of the male connector is used to detect the presence of additional units. As mentioned before, these set of male connectors can be housed in one physical connector 544, or can be housed in two separate connectors, depending on the requirements of the computer. Also, a stack connector 543 is foreseen which is able to establish communication between the different units, if provided. As already mentioned before, the stack connector 543 may be provided with one or a selection of different types of interfaces such as but not limited to I2C, serial peripheral interface or SPI, Quad Serial peripheral interface or QSPI and Peripheral Component Interconnect Express or PCIe, which will allow the top-level unit 520 to communicate with the other additional units 521, 522, if present.

So, in the case of FIG. 6A, no such additional unit is installed, and thus, as soon as the computer is turned on and provided with power, a flow of current will (or in this case will not) start to flow through the available ports of the connector 544. This unit, and more particular the SoM, is now able to identify itself as a top-level unit, since only the "0" pin of the position connectors is grounded. Also, when looking at the second set of male connectors, none of the pins are grounded, indicating that no additional units are connected with this top-level unit. Since the position detection indicates that this level or unit is located on position "0", and no other grounded signals are available by the presence detection, the SoM of unit 520 will identify itself as the unit on the lowest layer in the stack and will know that it is a stand-alone unit without additional units provided in the stack. Hence, the top-level unit 520 does not need to communicate with additional units via the stack connector 543.

In FIG. 6B a top-level unit 520 and one additional unit 521 is shown. On the CBA 540 of the additional unit 521, a female stack connector 544' is placed on one side which matches with the male stack connector 544" foreseen on the CBA 550 of the top-level unit 520, while a male stack connector 534" is placed on the opposite side of the CBA 540 of the additional unit. Similar to the setup in relation to FIG. 6A, the male part of the connector 544" is foreseen on one side of the CBA 550 of the top-level unit 520, allowing for the female counterpart 544' to be plugged in when the additional unit is be placed on the top-level unit 520. A first set of the male connector 544" is shown separate from a second set of male connectors 544", where the first set of the male connector is used to detect the position, while the second set of the male connector is used to detect the presence of additional units. Again, the two sets of each connector 544', 544" can be placed in one housing, or can be in two separate housings, depending on the needs or requirements for the computer. When two separate housings are used for the stack connector 544", it automatically follows that two separate and matching housings are foreseen for the stack connector 544'. Although two separate housings can be used for the stack connectors 544' and 544", it does not necessary mean that the male part of stack connector 534" is also in two separate housings. The routing from the stack connector 544' to the stack connector 534" is embedded in the CBA 540 and can be such that it is routed from two separate housings 544' to one housing 534". Likewise, a male stack connector 543" is installed on one side of the CBA 550 of the top level unit, which matches with a female stack connector 543' installed on one side of the CBA 540 of the additional unit 521. On the opposite side of the CBA 540, a male stack connector 533" is installed, to allow for a female stack connector 533' to be inserted, if one extra additional unit would be placed in the stack.

Now, with the top-level unit 520 and additional unit 521 stacked on each other and as such form a new computer, as soon as the computer is turned on, a flow of current will start to flow through the available ports of the connector 544. The top-level unit 520, and more particular the SoM, is now able to identify itself as the lowest unit in the stack, since only the "0" pin of the position connectors 544" is grounded. Also, when looking at the second set of male connectors, one of the pins is grounded, indicating that one additional unit 521 is connected with this top-level unit 520. When looking at the additional unit, this unit will detect that there are no grounded presence detection pins of its stack connector 534", meaning that there are no additional units place on top of this additional unit. When looking at the pins identifying the position in the stack, it will see that only the "1" pin of the position connectors 534" has become grounded, meaning that this unit is located on position 1 in the stack. Following, or alternatively simultaneously, the SoM of the top-level unit 520 will send out an I2C signal over the stacked connector 543 (via the connected stack connectors 534' and 534") to the above unit following a BUS protocol, in which the top-level unit enquires with the additional units what type of unit they are and what their function is. When no additional unit is present in the stack, as is the case in the example of FIG. 6A, the SoM will not get a reply back over the same BUS. In case there is an additional unit installed, as is the case for the example in FIG. 6B, a reply will be send back over the same stack connector 543 from the additional unit 521 to the top-level unit 520 with information about the function of the additional unit. The SoM of the top-level unit 520 is now able, with the received information via the stack connector 543, to identify which protocol and/or which I2C address it needs to use to address this particular unit during normal operation. In the library of the SoM, this protocol and/or I2C address is stored which will allow the SoM to identify which I2C address or internal interface needs to be used to address this particular unit. Once the top-level unit 520 knows which I2C address or internal interface to use, normal operation of the computer can continue.

Now, turning to FIG. 6C, a top-level unit 520 and two additional units 521, 522 are shown. On the CBA 530 of the second additional unit 522, a female stack connector 534' is placed on one side which matches with the male stack connector 534" foreseen on the CBA 540 of the first additional unit 520, while a male stack connector 554" is placed on the opposite side of the CBA 530 of the second additional unit. On the CBA 540 of the additional unit 521, a female stack connector 544' is placed on one side which matches with the male stack connector 544" foreseen on the CBA 550 of the top-level unit 520, while a male stack connector 534" is placed on the opposite side of the CBA 540 of the additional unit. Similar to the setup in relation to FIG. 6A, the male part of the connector 544" is foreseen on one side of the CBA 550 of the top-level unit 520, allowing for the female counterpart 544' to be plugged in when the additional unit is be placed on the top-level unit 520. Likewise, a male stack connector 543" is installed on one side of the CBA 550 of the top-level unit, which matches with a female stack connector 543' installed on one side of the CBA 540 of the additional unit 521. On the opposite side of the CBA 540, a male stack connector 533" is installed, to allow for a female stack connector 533' to be inserted, which is installed on one side of the CBA 530 of the second additional unit 522. On the opposite side of the CBA 530, a male stack connector 553" is installed, to allow for a female stack connector (not shown) to be inserted, if one extra additional unit would be placed in the stack.

Similar to the starting up of the computer of FIG. 6B, with a top-level unit 520, first additional unit 521 and second additional unit 522 stacked on each other and as such form a new computer, as soon as the computer is turned on, a flow of current will start to flow through the available ports of the connectors 544 and 534. The top-level unit 520, and more particular the SoM, is now able to identify itself as the lowest unit in the stack, since only the "0" pin of the position connectors 544" is grounded. Also, when looking at the second set of male connectors, two of the pins have become grounded, indicating that two additional units 521, 522 are provided in the stack together with this top-level unit 520. When looking at the first additional unit 521, this unit will detect that one presence detection pin of its stack connector 534" has become grounded, meaning that there is one additional unit 522 placed on top of this additional unit 521. When looking at the pins identifying the position in the stack, it will see that the "1" pin of the position connectors 534" is grounded, meaning that this unit is located on position 1 in the stack. When looking at the second additional unit 522, this unit will detect that there are no grounded presence detection pins of its stack connector 554", meaning that there are no additional units place on top of this additional unit. When looking at the pins identifying the position in the stack, it will see that the "2" pin of the position connectors 554" is grounded, meaning that this unit is located on position 2 in the stack.

Following, or alternatively simultaneously, the SoM of the top-level unit 520 will send out an I2C signal over the stacked connecter 543 to the above unit following a BUS protocol, in which the top-level unit enquires with the additional units what type of unit they are and what their function is. The connector 543 continues to send the I2C signal via the stack connector 533 to the above unit. In the present case, there are two additional units 521, 522 installed, and a reply will be send back over the same stack connector 543 from the first additional unit 521 to the top-level unit 520 and from the second additional unit 522 via stack connector 533 and stack connector 543 to the top-level unit 520 with information about the function of these additional units 521, 522. The SoM of the top-level unit 520 is now able, with the received information via the stack connectors 543 and 533, to identify which protocol and/or I2C address it needs to use to address this particular units during normal operation. In the library of the SoM, this protocol and/or I2C address is stored which will allow the SoM to identify which I2C address needs to be used to address the particular unit. Once the top-level unit 520 knows which I2C address to use, normal operation of the computer can continue.

As mentioned before, each additional unit is able to detect its respective position in the stack. This is relevant in case the same I2C address or internal interface needs to be used by the top-level unit to address this particular additional unit. E.g. in the example of FIG. 6C, the first additional unit 521 may be identical to the second additional unit 522. When the top-level unit 520 enquires over the stack connectors 543 and 533 what the function of the above additional units 521 and 522 is, both of them will reply with the same identifier to the top-level unit 520. When only this information is provided to the top-level unit 520, it will identify via the information contained in its library which protocol and internal interface or I2C address it needs to use to address the additional units, and it will end up with the same protocol, internal interface and/or I2C address for two different, however identical, additional units 521 and 522. However, because each additional unit 521, 522 is able to identify on which position in the stack it is placed, it can provide this location information together with the function information to the top-level unit 520. Similar to the library stored in the top-level unit 520, a similar library is also present in all additional units, where the same information is stored to identify the offset which will be used by the top-level unit depending on the location in the stack. Now, during normal operation, if a signal needs to be provided to the first additional unit 521, the top-level unit 520 will know from the start up procedure that this first additional unit 521 is in the first position in the stack, and by using a selecting mechanism such as a chip select or board select, the top-level unit 520 will send the required signal to the first additional unit 521 with an offset which corresponds to the position in the stack. Similar in case the top-level unit 520 needs to address the second additional unit 522. Again, an offset which corresponds to the position in the stack of this second additional unit 522 is given to the signal. When a signal which is intended for the second additional unit 522 now passes via the stack connector 543 over the same I2C address to the first additional unit 521, this first additional unit 521 will be able to detect that this signal is not intended for this first additional unit 521 since there is a mismatch between the offset of this first additional unit 521 and the offset of the signal. Only when the signal reaches the second additional unit 522 and the offset from the signal and this second additional unit 522 are the same, the signal will be used by this second additional unit 522.

Due to the above start-up method, the presence of these libraries in the top-level unit and additional units, and the fact that there are no synergies between the additional units, it is possible to replace a defect unit in the stack with an identical unit, to reposition the units in the stack, to replace them by other function units, or to remove units from the stack without the need to pre-program and re-certificate each possible combination again. Each additional unit is able to identify its position in the stack, look up the offset the top-level unit will use when sending a signal and identify, via this offset, if the signal is actually intended for the additional unit or not. The top-level unit in turn will only need to be able to identify the protocol and interfaces it needs to use to address each additional unit, and which offset to use when addressing this additional unit. It does not need to know the exact position in the stack of each additional unit.

In an alternative embodiment of the present invention, the top-level unit 520 may also be able to detect the number of additional units 521, 522 and identify the functionality of each additional unit 521, 522 by sending out a detection signal on each I2C address known by the top-level unit 520. For this, each respective additional unit will need to have a designated I2C address allocated to it, and when receiving this detection signal over its allocated I2C address, will send an identification signal back to the top-level unit. After receiving the identification signal from the respective additional unit, the top-level unit will know which I2C address to use to address a specific additional unit. The potential disadvantage of such a method is that the top-level unit 520 will need to send out the detection signal on each I2C address and wait for a reply on these addresses. If no feedback is received, there will be a time out, which indicates that there is no unit present at this I2C address. In the preferred method of the invention to identify which I2C addresses to use, such time out communication is not needed to start the computer, which results in a saving in time when starting the computer. However, this alternative embodiment may be adopted without departing from the present approach.

Figure 7A:
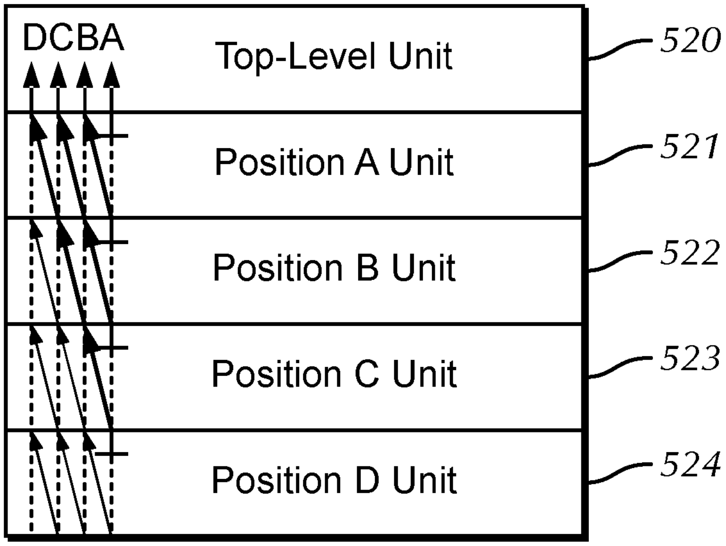
FIG. 7A illustrates an alternative method to identify the number of additional units installed in a system of the present invention.
Figure 7B:
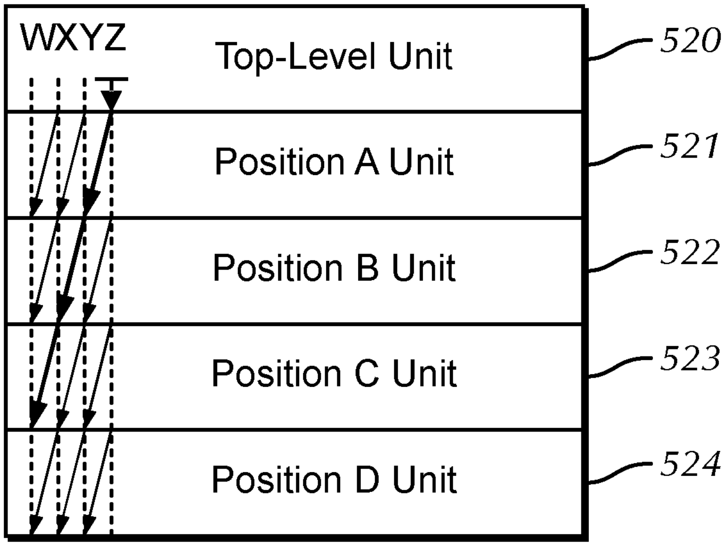
FIG. 7B illustrates an alternative method to identify the position of each additional unit installed in a system of the present invention.

Another alternative method of starting up a system according to the present invention is shown in FIG. 7A and FIG. 7B and is explained in relation to a computer having a top-level unit 520 and four additional units 521-524. If more additional units are installed in the computer, additional channels will be used. If less additional units are installed in the computer, less channels will be used. In order to detect the number of units in the stack, when starting the computer, position signals are send out by the additional units 521-524 in their respective channel A (see FIG. 7A). The bottom unit 524 will not receive a signal from a unit below it, and will thus be the last one in the stack. The signal from the bottom unit 524 will be received by the unit 523 stacked above unit 524 and this signal will be shifted by unit 523 from channel A to channel B. This shifting is done by an internal routing in the CBA of the unit 523. Unit 523 will also send out its own position signal on his channel A. The next unit 522 will thus receive a position signal entering on his channel A from the unit 523 positioned just below the unit 522, and will also receive a position signal on his channel B from the unit 524. Since the unit 522 thus receives 2 position signals, it is clear that there are two units 523 and 524 underneath unit 522. Both position signals received by unit 522 are shifted by one channel due to an internal routing in the CBA of the unit 522, so the position signal originating from unit 523 and received by unit 522 on his channel A, will be shifted to channel B, while the position signal originating from unit 524 and received by unit 523 on channel A and received by unit 522 on channel B, will be shifted to channel C.

Now, three different position signals are received by unit 521, which in this example is placed directly underneath the top-level unit 520. As was the case with the lower level units 522 and 523, the position signals from the lower level units 522, 523 and 524 are shifted one channel by the internal routing in the CBA of the unit 521, so that the position signal from unit 522 is shifted from the channel A to the channel B, the position signal from unit 523 is shifted from channel B to channel C and the position signal from unit 524 is shifted from channel C to channel D. Unit 521 will in its turn send out a position signal on channel A.

Now, the top-level unit 520 will scan his respective channels, will have received 4 position signals on his channels A, B, C and D and will determine that there are four additional and active units 521-524 in the system 500 by counting how many position signals are grounded or received by the top-level unit 520. The detection of the number of units in the system is thus realized by allowing each unit in the system to shift the bottom-to-top position signal by one position due to an internal routing in the CBA of the units (so from channel A to channel B to channel C to channel D in the example of FIG. 7A) and use the channel A to ground the position signal of the particular unit. The position signals can be a continuous signal, or just one signal send out by each additional unit on its respective channel A upon startup. Important is that the received signals by each unit will be shifted to the next available channel when received by a unit, and that the top-level unit 520 will be able to identify on which channels it receives a signal or a continuous stream of signals.

Once the number of additional units is determined, the position of each of these addition units 521-524 in the stack needs to be detected by the additional unit 521-524 itself. This is accomplished by sending out a single grounding signal by the top-level unit 520 on a downward channel Z to the below unit 521 (see FIG. 7). The unit 521 will receive this signal on his channel Z and will shift, again via an internal routing in the CBA of the unit, the signal by one channel, to channel Y. Since the unit 521 receives the grounding signal of the top-level unit on his channel Z, it will determine that it is the unit placed directly underneath the top-level unit 520. As said, the unit 521 will have shifted the grounding signal of the top-level unit 520 by one position (so channel Y) and will transfer it to the unit 522 placed underneath him. This unit 522 will now receive the grounding signal of the top-level unit 520 on its channel Y and will determine that he is located in the second position in the stack, so having one additional unit 521 in between the top-level unit 520 and itself 522. Again, the unit 522 will shift the grounding signal of the top-level unit 520 by one position (so now from channel Y to channel X) and will transfer it to the unit 523 placed underneath him. This unit 523 will now receive the grounding signal of the top-level unit 520 on the channel X and will determine that he is located in the third position in the stack, so having two additional units 521 and 522 in between the top-level unit 520 and itself 523. Finally in the example of FIG. 7, the unit 523 will shift the grounding signal of the top-level unit 520 by one position (so now from channel X to channel W) and will transfer it to the unit 524 placed underneath him. This unit 524 will now receive the grounding signal of the top-level unit 520 on the channel W and will determine that he is located in the fourth position in the stack, so having three additional units 521, 522 and 523 in between the top-level unit 520 and itself 524. Since there is no additional unit underneath the unit 524, the shifting of the grounding signal of the top-level unit 520 comes to a stop and no signals are transferred to a below unit. As an alternative, the additional units 521-524 may, after receive the grounding signal, determine first their position in the stack before shifting the grounding signal by one channel. Again, the grounding signal can be a continuous signal, or just one signal send out by the top-level unit on its channel Z. Important is that each additional unit will be able to identify on which channel it receives a signal or a continuous stream of signals.

Upon detection of each unit 521-524 of its unique position in the stack, each unit will generate a unique I2C slave address. A convention is stored in a library in the top-level unit 520 and in the additional units 521-524, which will allow the units to determine which position in the stack corresponds to which specific I2C slave address. These I2C slave address can now be used by the top-level unit 520 to address the specific unit. It is not necessary for the top-level unit to know which additional unit is corresponding to which I2C slave address. The top-level unit simply needs to know which channels are used, so that it is avoided that the top-level unit is sending out information on a non-used I2C slave address or tries to read from this channel. Finally, the additional units 521-524 will send information about the functionality of the additional unit over the I2C slave address to the top-level unit 520. Once all units have determined their individual addresses and used this individual address to send over the functionality information to the top-level unit 520, the initiation process is finished and the computer 500 is now ready to be used. These individual addresses thus allocated by the preferred and alternative method allows the top-level unit 520 to address all units 521-524 without any address overlap and without the need to have complicated and expensive interfaces.

As an example, the top-level unit 520 may hold a I2C master device, a QSPI master device supplemented with 4 chip selects and a 4 lane PCIe gen 2 (root complex) device. The other units 521, 522 may hold a I2C slave device, a 0 to 4 SPI slave device(s) and 0 to 4 lane PCIe gen 2 (end point) device(s). Since the top-level unit 520 holds 4 chip selects, the top-level unit is able to communicate with 4 SPI slave devices via the 4 different chip selects. Such a setup will allow a maximum of 4 additional units, each containing 1 SPI slave device, 1 unit containing 4 SPI slave devices or any other combination having in total a maximum of 4 SPI slave devices. The same goes for the PCIe slave devices. Each combination is possible, as long as it does not exceed a total number of 4 PCIe slave devices.

Every unit will communicate via the I2C interfaces of the bridging stack connectors 543, 533 how many lanes or slaves the unit is using to the top-level unit 520. Those units which do not use e.g. the SPI interface will simply loop the SPI interface to the next unit. So, if only the bottom unit is using the SPI interface, the units in between will loop their respective (inactive) SPI interface to the one below such that a connection can be assured between the top-level unit 520 and the bottom unit 532. Units which do use the SPI interface will always use the first available chip select (position A; see FIG. 6) and will shift the other positions. So B will be shifted to position A, C to B, and D to C. In case a unit is using 2 SPI slave devices, the chip select in positions A and B will be used. The slave device will then loop the chip select from positions C to A and from D to B for the unit below. That way, the top-level unit will be able to communicate with each additional unit regardless of its position in the stack.

Figure 3:
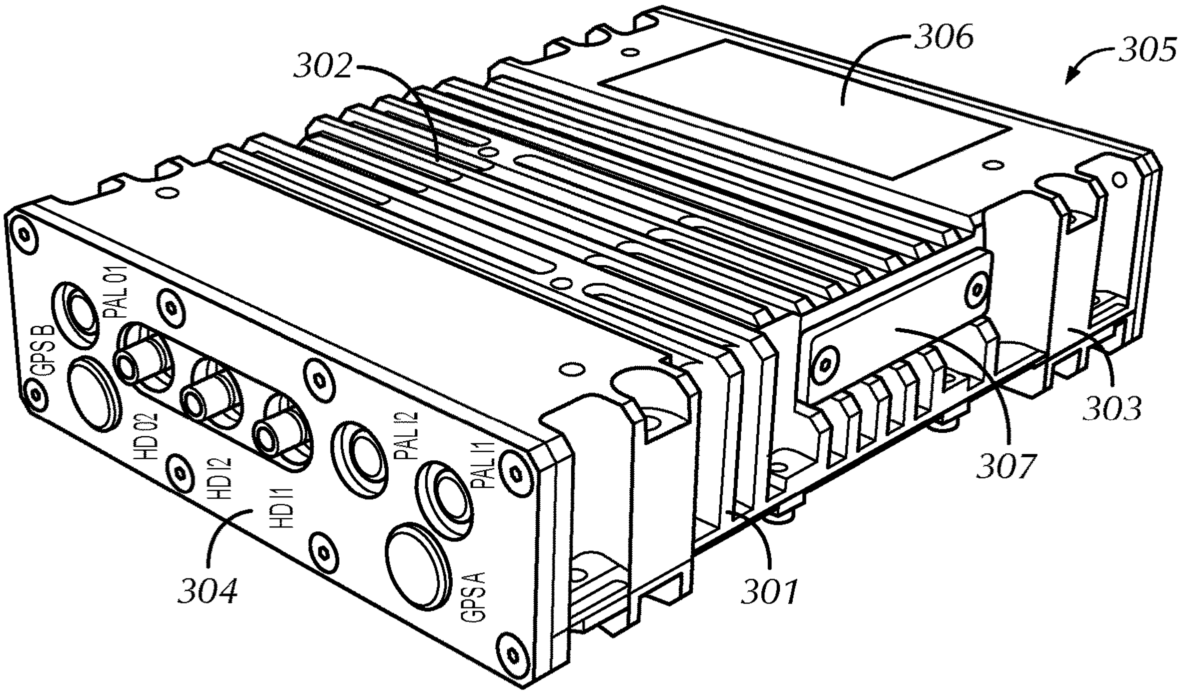
FIG. 3 is an isometric view of an embodiment of the prior art for a non-visual airborne instrument.

Now, turning back to FIG. 3. FIG. 3 shows a certified airborne system of the prior art. The illustrated system is a single layered computer which is placed inside a sealed housing (301), with a case designed for passive cooling (302), and the ability to tightly screw it (303) inside the aircraft. The connectors are designed to connect firmly with rotational locks (304), in this case tuned to video input/output and positioning system information. Power is supplied as 28 VDC (with a wide range) at the back (305). Important configuration management information is provided as a firmly fixed label (306). Maintenance connectors are hidden behind a sealed door (307). Inside the embodiment, the certified hardware runs the certified software.

Figure 4A:
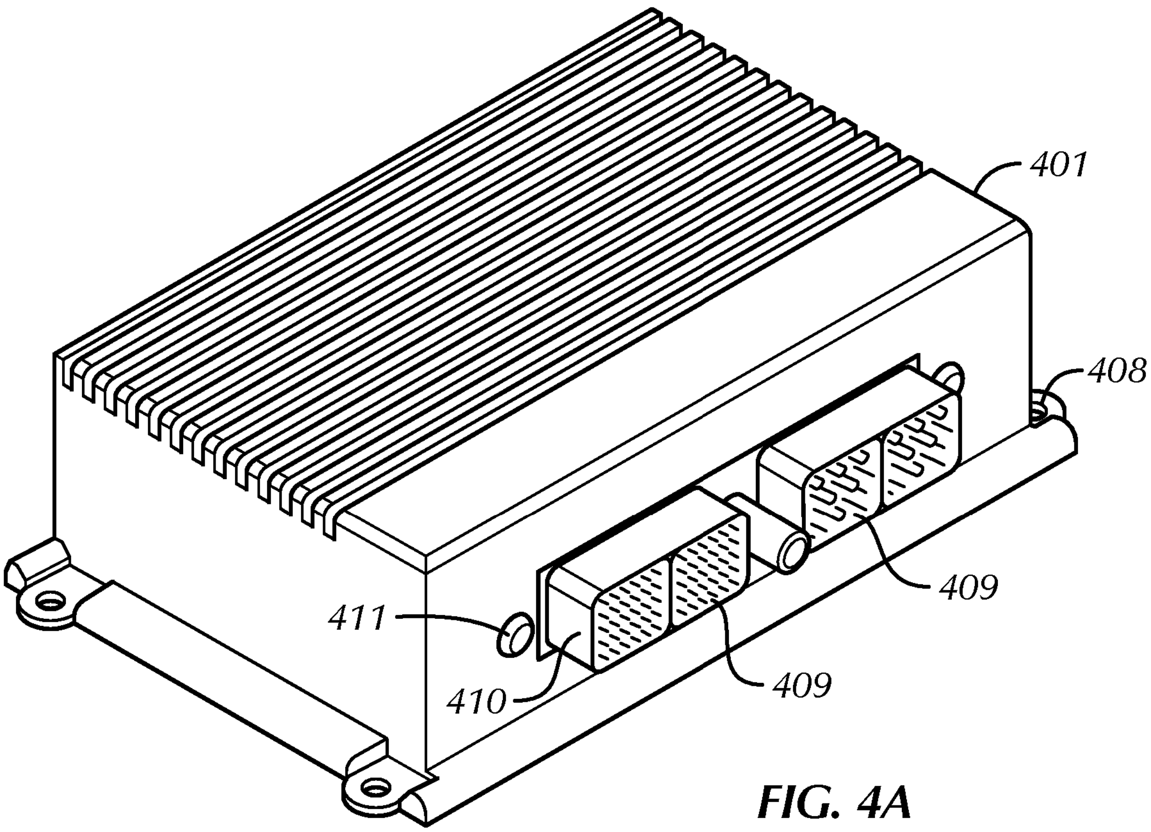
FIGS. 4A-4C are isometric views of embodiments of the present invention for a non-visual airborne instrument.
Figure 4B:
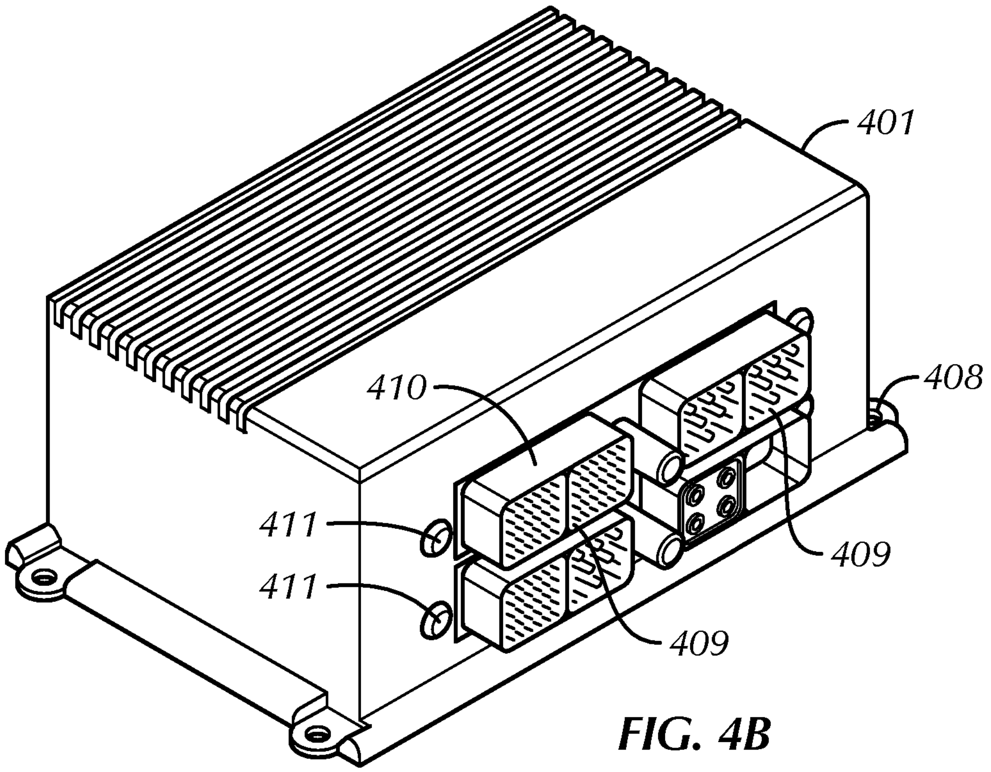
Figure 4C:
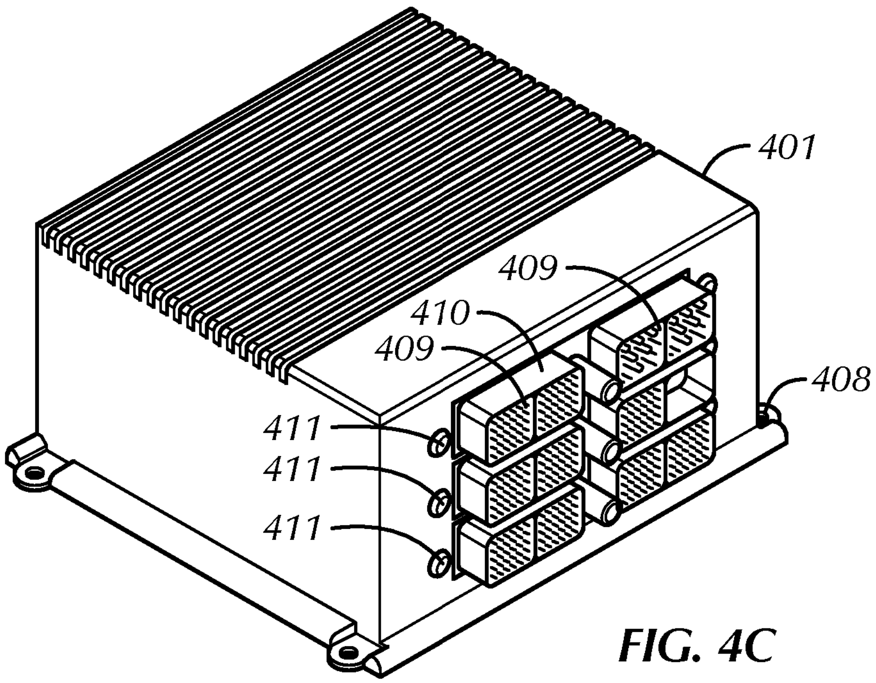

FIGS. 4A-4C shows certified airborne systems according to the present invention. Depending on the number of layers or units used inside the computer housing, the housing will differ in size. FIG. 4A is a single layered computer similar to the single layered computer shown in FIG. 3. The computer is placed inside a sealed housing (401), with a case designed for passive cooling. Holes (408) are foreseen in the housing (401) to allow the computer to be screwed tightly inside the aircraft. When comparing the computer of FIG. 3 with the computer of the current invention as shown in FIG. 4A, it is obvious that only a limited number of I/O connectors are foreseen with the computer of FIG. 4A. As explained above, the computers of the current invention will only need to be equipped with the necessary I/O connectors (409) for this particular computer. No additional and not used I/O connectors will be available on the computer of the present invention.

When multiple units are installed as is the case in the computers of FIGS. 4B and 4C, the designated I/O connectors (409)—if any—of each unit are placed underneath each other through openings (410) foreseen in the housing (401). Bolts (411) or other fastening means are used on each side of the opening (410) to connect the I/O connectors (409) to the housing (401). Using such an additional connection to connect each individual unit to the housing (401) will provide for additional strength to the entire system, additionally to the benefits of having a stacked configuration. A seal (not shown) is foreseen between the I/O connectors (409) and the housing (401) to guarantee the sealing of the computer housing. Inside the embodiment, the pre-certified hardware runs the pre-certified software.

The examples of FIG. 5, FIGS. 7A-7B and FIGS. 8B-8D show a top-level unit and additional units located under this top-level unit in the stack. However, as is clear from FIGS. 6A-6C, the top-level unit can also be located in the bottom of the stack, with the additional units stacked on top of this top-level unit. Likewise, the top-level unit can be located at a different position than the top or bottom position. Important however is that each unit can locate its position in the stack and the top-level unit knows which offset to use when sending the signals to the additional units over the necessary interface using the correct protocol.

As an alternative (not shown), the housing of a computer—being a single layered or multi layered computer—can be designed such that multiple individual computer units can be connected to each other by having connection holes on the top and bottom of the housing. Placing e.g. two computer units on top of each other, aligning the top holes of the bottom computer with the bottom holes of the top computer, and providing connection means (e.g. bolts and nuts) in the aligned holes, will connect the two computer units with each other. Now, only the bottom computer unit needs to be connected inside the airplane.

An additional advantage of the present invention is that the computer will be able to identify at any time if all additional units and the top-level unit itself is still active and working correctly and/or that all connectors bridging the different units is still functioning correctly. During start-up of the computer, the top-level unit will be able to identify the number of additional units in the stack via the presence detection during start-up. In the examples of FIGS. 6A-6C, these signals should remain the same during operation. However, if for some reason one of the signals which became grounded during the startup of the computer, is no longer grounded, this will trigger an alarm and potentially trigger a close-off or bypass protocol. Similar, if one of the additional units is no longer able to detect a position signal, this is again an indication that something is wrong with one of underlying units. Again, this can trigger an alarm and potentially trigger a close-off or bypass protocol. Such a bypass protocol could be that the backup computer, if present in the airplane, which is an exact copy of the failing computer will be started and will take over the function of the failing computer.

Besides this automatic detecting functionality of the units, the top-level unit is also able to perform Build in Tests (BIT). A first type of BIT is an Integrated BIT or I-BIT, where the top-level unit will send out on a determined point in time a detection signal over the I2C bus to all additional units to see if all units provide a feedback. If the same number of units are providing feedback, all units are still functioning. If not, there is an issue with one of the units. A second type of BIT is an Power-On BIT or P-BIT. During, or shortly after starting the computer, the top-level unit can send out a detection signal over the I2C bus to all additional units to see if all units provide a feedback. A third type is a continuous BIT or C-BIT, where the top-level unit is constantly sending out a detection signal.

As will be appreciated by one of skill in the art, aspects or portions of the present approach may be embodied as a method, system, and/or process, and at least in part, on a computer readable medium. The computer readable medium may be used in connection with, or to control and/or operate, various pneumatic, mechanical, hydraulic, and/or fluidic elements used in systems, processes, and/or apparatus according to the present approach. Accordingly, the present approach may take the form of combination of apparatus, hardware and software embodiments (including firmware, resident software, micro-code, etc.) or an embodiment combining software and hardware aspects that may all generally be referred to herein as a "circuit," "module" or "system." Furthermore, the present approach may include a computer program product on a computer readable medium having computer-usable program code embodied in the medium, and in particular control software. The present approach might also take the form of a combination of such a computer program product with one or more devices, such as a modular sensor brick, systems relating to communications, control, an integrate remote control component, etc.

Any suitable non-transient computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the non-transient computer-readable medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a device accessed via a network, such as the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any non-transient medium that can contain, store, communicate, propagate, or transport the program for use by or in connection with the instruction execution system, apparatus, or device.

Computer program code for carrying out operations of the present approach may be written in an object oriented programming language such as Java, C++, etc. However, the computer program code for carrying out operations of the present approach may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present approach may include computer program instructions that may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transient computer-readable memory, including a networked or cloud accessible memory, that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to specially configure it to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Any prompts associated with the present approach may be presented and responded to via a graphical user interface (GUI) presented on the display of the mobile communications device or the like. Prompts may also be audible, vibrating, etc.

Any flowcharts and block diagrams in the Figures illustrate the architecture, functionality, and operation of possible implementations of systems, methods and computer program products according to various embodiments of the present approach. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the approach. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The invention may be embodied in other specific forms without departing from the spirit or essential characteristics thereof. The present embodiments are therefore to be considered in all respects as illustrative and not restrictive, the scope of the invention being indicated by the claims of the application rather than by the foregoing description, and all changes which come within the meaning and range of equivalency of the claims are therefore intended to be embraced therein.

The invention claimed is:

1. A control loop application system comprising a plurality of units of electric circuit boards arranged in a stacked configuration, the control loop application system further comprising a top-level unit and a plurality of additional units, each additional unit having components needed to perform at least one specific function for which the respective additional unit is designed, characterized in that the top-level unit having components such that the top-level unit is able to perform as a standalone unit without requiring the additional units, wherein the system is configured to send a grounding signal from the top-level unit on a first channel of a stack connector to a first additional unit in the plurality of additional units, shift the grounding signal from the first channel to a next available channel in the stack connector placed between the first additional unit and a second additional unit, determining the position of the second additional unit in the stack by determining the channel on which the grounding signal was received by the second additional unit and transferring the grounding signal to the next additional unit in the plurality of additional units, repeating the sending out of grounding signals, the shifting of the received ground signal and the determining of the position by the additional unit for each additional unit in the plurality of additional units have a determined position in the stack.

2. The control loop application system according to claim 1, wherein the first additional unit has at least one I/O interface directly installed on the at least additional unit to accommodate for the at least one specific function of the additional unit.

3. The control loop application system according to claim 1, wherein the top-level unit comprises a power supply to provide power for the system.

4. The control loop application system according to claim 1, wherein each additional unit operates independent from another additional unit in the stack.

5. The control loop application system according to claim 1, wherein the first additional unit-in combination with a top-level unit forms a pre-certified system.

6. The control loop application system according to claim 1, wherein the top-level unit comprises a top-level unit circuit board, a processing unit and an interconnection board holding at least one I/O interface.

7. The control loop application system according to claim 6, wherein the at least one I/O interface is a Gigabit Ethernet, RS-485, ARINC-429, CAN or GPIO interface.

8. The control loop application system according to claim 1, wherein the first additional unit contains a circuit board having a mass storage card and an interconnection board holding at least one unit specific interface, such that the top-level unit and the additional unit form a mass storage and communication computer.

9. The control loop application system according to claim 8, wherein the at least one unit specific interface is a Wi-Fi, Bluetooth or cellular interface.

10. The control loop application system according to claim 1, wherein the first additional unit contains a circuit board and an interconnection board holding at least one unit specific interface such that the top-level unit and the additional unit form a video system which is able to generate a graphics output.

11. The control loop application system according to claim 10, wherein the generated graphics outputs are EICAS, MFD or PFD graphics output and the unit specific interfaces are video inputs and/or video output.

12. The control loop application system according to claim 1, wherein the first additional unit is an edge unit containing a circuit board and an interconnection board holding at least one edge unit specific interface such that the top-level unit and the additional edge unit form an edge system which is able to collect sensor data on a remote location and send the collected data to a central computer.

13. The control loop application system according to claim 1, wherein the system is a hybrid system formed by the top-level unit and at least one of an additional unit for mass storage and communication, an additional unit for graphics output generation, and at least one additional edge unit containing a circuit board and an interconnection board holding at least one edge unit specific interface such that the top-level unit and the additional edge unit form an edge system which is able to collect sensor data on a remote location and send the collected data to a central computer.

14. The control loop application system according to any of the preceding claims, characterized in that at least one stack connector having a main interface is placed in between the top-level unit and the plurality of additional units in the stack.

15. The control loop application system according to claim 14, wherein at least one additional stack connector having a main interface is placed in between two additional units in the stack.

16. The control loop application system according to claim 14, wherein the at least one stack connector further comprises at least one additional interface to allow communication between the top-level unit and the plurality of additional units.

17. The control loop application system according to claim 16, wherein the main interface is an I2C slave interface and the at least one additional interface is a serial peripheral interface, a Quad Serial peripheral and/or a Peripheral Component Interconnect Express interface.

18. The control loop application system according to claim 2, wherein the I/O interfaces are directed to the same side in the stack.

19. The control loop application system according to claim 1, wherein the system is a safety-critical system, and more particularly an airborne safety-critical system or a ground-based aviation support system.

20. A method to determine the number of additional units in a stacked control loop application system according to claim 1, characterized in that a stack connector is foreseen between the different units, and that the method comprises the steps of:

sending out a position signal on a first channel of a stack connector by each additional unit in the stack to the unit placed above the each additional unit in the stack, shifting the received position signal from the below unit to the next available channel, transmitting the position signals to the above placed unit, repeating the step of shifting of the received position signals to the next available channel and transmitting the position signals to the above placed unit until all position signals have reached the top-level unit, scanning by the top-level unit-of the channels of the stack connector connecting the top-level unit with the additional unit below the top level unit to determine which channels are sending out a position signal, and determining the number of channels used and using this number to determine the number of additional units.

21. A method to determine the position of the additional units in a control loop application system comprising a plurality of units of electric circuit boards arranged in a stacked configuration, a top-level unit and a plurality of additional units, each additional unit having components needed to perform at least one specific function for which the respective additional unit is designed, the method comprising:

sending a grounding signal by the top-level unit on a first channel of a stack connector to the below additional unit, shifting the grounding signal from the first channel-to the next available channel in the stack connector placed between additional units, determining the position of the additional unit in the stack by the additional unit by determining the channel on which the grounding signal was received by the additional unit and transferring the grounding signal to the next additional unit, repeating the sending out of the grounding signal, the shifting of the received ground signal and the determining of the position by the additional unit until all other additional units have determined their position in the stack.

22. A method of compiling a control loop application system according to claim 1, characterized in that:

at least one of the top-level unit and at least one additional unit in the plurality of additional units undergoes a precertification process, and a combination of the pre-certified top-level unit and the at least one pre-certified additional unit is arranged in a stacked configuration to form a control loop application system with pre-certified units.

23. A method to determine the number of additional units in a stacked control loop application system comprising a plurality of units of electric circuit boards arranged in a stacked configuration, a top-level unit and a plurality of additional units, each additional unit having components needed to perform at least one specific function for which the respective additional unit is designed, a plurality of stack connectors wherein the top-level unit and each additional unit is separated by a stack connector, the method comprising:

sending out a position signal on a first channel of a stack connector by each additional unit in the stack to the unit placed above an additional unit in the stack, shifting the received position signal from the below unit to a next available channel, transmitting the position signals to the above placed unit, repeating the step of shifting of the received position signals to the next available channel and transmitting the position signals to the above placed unit until all position signals have reached the top-level unit, scanning by the top-level unit of the channels of the stack connector connecting the top-level unit with the additional unit below the top-level unit to determine which channels are sending out a position signal, and determining the number of channels used and using this number to determine the number of additional units.

* * * * *